(12) United States Patent　　(10) Patent No.: US 11,950,010 B2
Nishino　　(45) Date of Patent: Apr. 2, 2024

(54) IMAGING APPARATUS AND IMAGING SYSTEM

(71) Applicant: Sony Semiconductor Solutions Corporation, Kanagawa (JP)

(72) Inventor: Tatsuki Nishino, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/740,682

(22) Filed: May 10, 2022

(65) Prior Publication Data

US 2022/0272297 A1　　Aug. 25, 2022

Related U.S. Application Data

(63) Continuation of application No. 16/478,170, filed as application No. PCT/JP2018/038612 on Oct. 17, 2018, now Pat. No. 11,356,628.

(30) Foreign Application Priority Data

Oct. 31, 2017　(JP) ................. 2017-210013

(51) Int. Cl.
　*H04N 5/3745*　(2011.01)
　*G01S 17/89*　(2020.01)
　(Continued)

(52) U.S. Cl.
　CPC ............ *H04N 25/77* (2023.01); *G01S 17/89* (2013.01); *G01S 17/931* (2020.01);
　(Continued)

(58) Field of Classification Search
　None
　See application file for complete search history.

(56) References Cited

U.S. PATENT DOCUMENTS 9,671,284 B1 *　6/2017　Dandin ............... H03K 17/74
2001/0020673 A1 *　9/2001　Zappa ................... G01J 1/44
　　　　　　　　　　　　　　　　　　　　250/214 R
(Continued)

FOREIGN PATENT DOCUMENTS

CN　　106657826 A　　5/2017
CN　　107063452 A　　8/2017
(Continued)

OTHER PUBLICATIONS

Title: "Design of passive-quenching active-reset circuit with adjustable hold-off time for single-photon avalanche diodes" Author: I. Berdalović; Ž. Osrečki; F. Šegmanović; D. Grubišić; T. Knežević; T. Suligoj Date: Jul. 28, 2016 (Year: 2016).*

(Continued)

*Primary Examiner* — Twyler L Haskins
*Assistant Examiner* — Wesley J Chiu
(74) *Attorney, Agent, or Firm* — Wolf, Greenfield & Sacks, P.C.

(57) ABSTRACT

This technology relates to an imaging apparatus and an imaging system for improving the accuracy of distance measurement performed by use of SPADs.
The imaging apparatus includes a pixel array section having pixel sections arrayed therein. Each pixel section includes: an SPAD (single photon avalanche photodiode); a resistance component configured to be connected serially with the SPAD; an output section configured to output a light reception signal indicating photon incidence on the SPAD; and a pulse generation section configured to output a pulse signal in synchronism with the output of the light reception signal. Each pixel sections further includes at least one of: a switch configured to be connected interposingly between the SPAD and the resistance component and turned off in synchronism with the pulse signal; or a pull-in section configured to pull (Continued)

in an input current flowing through the SPAD via the resistance component in synchronism with the pulse signal, thereby suppressing the input current flowing through the SPAD. This technology may be applied to cameras that capture range images, for example.

12 Claims, 19 Drawing Sheets

(51) Int. Cl.
   *G01S 17/931*   (2020.01)
   *H01L 27/146*   (2006.01)
   *H01L 31/02*    (2006.01)
   *H01L 31/107*   (2006.01)
   *H04N 25/77*    (2023.01)
   *H04N 25/79*    (2023.01)

(52) U.S. Cl.
   CPC .. *H01L 27/14643* (2013.01); *H01L 31/02027* (2013.01); *H01L 31/107* (2013.01); *H04N 25/79* (2023.01)

(56) References Cited

U.S. PATENT DOCUMENTS

| | | |
|---|---|---|
| 2005/0012033 A1* | 1/2005 | Stern ................. G01T 1/2928 250/214 R |
| 2008/0290259 A1 | 11/2008 | Mathewson et al. |
| 2011/0266420 A1* | 11/2011 | Eldesouki ............ H01L 31/107 250/214.1 |
| 2014/0103196 A1 | 4/2014 | Soga et al. |
| 2016/0044296 A1 | 2/2016 | Sun et al. |
| 2016/0182902 A1 | 6/2016 | Guo et al. |
| 2017/0131143 A1* | 5/2017 | Andreou ......... H01L 31/035272 |
| 2018/0090526 A1 | 3/2018 | Mandai et al. |
| 2018/0090536 A1* | 3/2018 | Mandai ............ H01L 27/14643 |
| 2018/0120152 A1* | 5/2018 | Leonardo ............ H01L 31/125 |
| 2018/0203046 A1 | 7/2018 | Takemura |
| 2018/0372539 A1 | 12/2018 | Goden |
| 2019/0068908 A1* | 2/2019 | Kobayashi ............. H04N 25/40 |
| 2019/0113385 A1 | 4/2019 | Fukuchi |
| 2019/0189827 A1* | 6/2019 | Haraguchi ........... H04N 25/709 |
| 2020/0158566 A1* | 5/2020 | Ota ...................... H04N 25/772 |
| 2020/0252564 A1* | 8/2020 | Palubiak ............... H04N 25/75 |
| 2020/0296313 A1 | 9/2020 | Nishino |
| 2020/0396410 A1* | 12/2020 | Ta ..................... H01L 31/02027 |

FOREIGN PATENT DOCUMENTS

| | | |
|---|---|---|
| EP | 1 132 725 A2 | 9/2001 |
| JP | 2008-542706 A | 11/2008 |
| JP | 2010-283266 A | 12/2010 |
| JP | 2014-160042 A | 9/2014 |
| JP | 2015-117970 A | 6/2015 |
| WO | WO 2015/059663 A1 | 4/2015 |

OTHER PUBLICATIONS

Title: "NE521 High-Speed Dual-Differential Comparator/Sense Amp" Date: Oct. 2006 (Year: 2006).*
U.S. Appl. No. 16/478,170, filed Jul. 16, 2019, Nishino.
International Search Report and English translation thereof dated Nov. 20, 2018 in connection with International Application No. PCT/JP2018/038612.
International Written Opinion dated Nov. 20, 2018 in connection with International Application No. PCT/JP2018/038612, and English translation thereof.
International Preliminary Report on Patentability dated May 14, 2020 in connection with International Application No. PCT/JP2018/038612, and English translation thereof.
Extended European Search Report dated Dec. 19, 2019 in connection with European Application No. 18873598.9.
Gallivanoni et al., Progress in quenching circuits for single photon avalanche diodes. IEEE Transactions on Nuclear Science, IEEE Service Center, New York, NY. Vol. 57(6); Dec. 2010, pp. 3815-3826.
Liu et al., Reduce Afterpulsing of Single Photon Avalanche Diodes Using Passive Quenching With Active Reset, IEEE Journal of Quantum Electronics, May 2008, vol. 44, No. 55, pp. 430-434.

* cited by examiner

IMAGING APPARATUS AND IMAGING SYSTEM

CROSS-REFERENCE TO RELATED APPLICATIONS

The present application claims the benefit under 35 U.S.C. § 120 as a continuation application of U.S. application Ser. No. 16/478,170, filed on Jul. 16, 2019, now U.S. Pat. No. 11,356,628, which claims the benefit under 35 U.S.C. § 371 as a U.S. National Stage Entry of International Application No. PCT/JP2018/038612, filed in the Japanese Patent Office as a Receiving Office on Oct. 17, 2018, which claims priority to Japanese Patent Application Number JP2017-210013, filed in the Japanese Patent Office on Oct. 31, 2017, each of which applications is hereby incorporated by reference in its entirety.

TECHNICAL FIELD

The present technology relates to an imaging apparatus and an imaging system. More particularly, the technology relates to an imaging apparatus and an imaging system using an SPAD (single photon avalanche photodiode).

BACKGROUND ART

Heretofore, imaging apparatuses have been developed that measure the distance to an object using pixels each furnished with the SPAD.

With the SPAD, there sometimes occurs what is known as an after-pulse phenomenon in which some of the carriers (electrons and holes) generated by avalanche multiplication are trapped by impurity levels before being discharged at a later time, triggering another avalanche multiplication without the incidence of photons. The after-pulse phenomenon can cause the SPAD to prolong its dead time in which no photon is detectable, or let the SPAD erroneously detect the incidence of a photon despite its absence. As a result of this, the accuracy of distance measurement worsens.

To counter the phenomenon, techniques have been proposed by which the SPAD and a capacitance for biasing it are connected with a power source during a refresh period and disconnected during a detection period with a view to suppressing after-pulse generation (e.g., see PTL 1).

Specifically, the invention described in PTL 1 involves electrically charging the capacitance during the refresh period so that the capacitance applies to the SPAD a reverse voltage equal to or higher than a breakdown voltage. When the voltage of the capacitance exceeds the breakdown voltage, a switch is turned off to disconnect the SPAD and the capacitance from the power source, thereby starting the detection period. When a photon enters the SPAD during the detection period to generate avalanche multiplication, the carriers accumulated in the capacitance are discharged via the SPAD. This causes the voltage applied to the SPAD by the capacitance to drop below the breakdown voltage, causing avalanche multiplication to stop. Upon elapse of a delay time with a delay circuit after the drop of the capacitance voltage below the breakdown voltage, the switch is turned on to connect the SPAD and the capacitance with the power source to start the refresh period. In this manner, the current flowing through the SPAD during generation of avalanche multiplication is suppressed, which suppresses after-pulse generation.

Also with the SPAD, a phenomenon may occur in which, following generation of avalanche multiplication, the current flowing into the SPAD typically via a quenching resistance fails to drop below a latching current, preventing the SPAD from restoring its voltage and prolonging the dead time (e.g., see PTL 2). As a result, the accuracy of distance measurement worsens.

CITATION LIST

Patent Literature

PTL 1

Japanese Patent Laid-open No. 2008-542706

PTL 2

Japanese Patent Laid-open No. 2014-160042

SUMMARY

Technical Problems

However, according to the invention described by PTL 1, after-pulse generation during the refresh period can cause a feed-through between the power source and ground. Because the cathode potential of the SPAD is in a floating state during the detection period, noise resistance drops during that time. Furthermore, the refresh period is started following the delay with the delay circuit after the capacitance voltage drops below the breakdown voltage. This causes the dead time to vary significantly.

Moreover, PTL 2 has no mention of measures to deal with the latching current.

The present technology has been devised in view of the above circumstances and is aimed at improving the accuracy of distance measurement performed by use of the SPADs.

Solution to Problems

According to a first aspect of the present technology, there is provided an imaging apparatus including a pixel array section having pixel sections arrayed therein. Each of the pixel sections includes: an SPAD (single photon avalanche photodiode); a resistance component configured to be connected serially with the SPAD; an output section configured to output a light reception signal indicating photon incidence on the SPAD; and a pulse generation section configured to output a pulse signal in synchronism with the output of the light reception signal. Each pixel section further includes at least one of: a switch configured to be connected interposingly between the SPAD and the resistance component and turned off in synchronism with the pulse signal; or a pull-in section configured to pull in an input current flowing through the SPAD via the resistance component in synchronism with the pulse signal, thereby suppressing the input current flowing through the SPAD.

According to a second aspect of the present technology, there is provided an imaging system including: a lighting apparatus configured to emit irradiation light; and an imaging apparatus configured to receive reflected light stemming from the irradiation light. The imaging apparatus includes a pixel array section having pixel sections arrayed therein, each of the pixel sections including: an SPAD (single photon avalanche photodiode); a resistance component configured to be connected serially with the SPAD; an output section configured to output a light reception signal indicating photon incidence on the SPAD; and a pulse generation section configured to output a pulse signal in synchronism with the output of the light reception signal. Each pixel sections further includes at least one of: a switch configured to be connected interposingly between the SPAD and the resistance component and turned off in synchronism with the pulse signal; or a pull-in section configured to pull in an input current flowing through the SPAD via the resistance component in synchronism with the pulse signal, thereby suppressing the input current flowing through the SPAD.

According to the first aspect of the present technology, the pulse signal is output in synchronism with the output of the light reception signal indicating a photon being incident on the SPAD. The switch connected interposingly between the SPAD and the resistance component is turned on in synchronism with the pulse signal. The input current flowing through the SPAD is pulled in via the resistance component in synchronism with the pulse signal. This suppresses the input current flowing through the SPAD.

According to the second aspect of the present technology, illumination light is emitted, and reflected light stemming from the illumination light is received. The pulse signal is output in synchronism with the output of the light reception signal indicating a photon being incident on the SPAD. The switch connected interposingly between the SPAD and the resistance component is turned on in synchronism with the pulse signal. The input current flowing through the SPAD is pulled in via the resistance component in synchronism with the pulse signal. This suppresses the input current flowing through the SPAD.

Advantageous Effects of Invention

According to the first or the second aspect of the present technology, the dead time of the SPAD is prevented from being prolonged or varied significantly. As a result, the accuracy of distance measurement performed by use of the SPAD is improved.

Incidentally, the advantageous effects stated in this description are only examples and are not limitative of the present technology. There may be additional advantageous effects derived from and not covered by this description.

DESCRIPTION OF EMBODIMENTS

Preferred embodiments for practicing the present technology (referred to as the embodiment) are described below. The description is given under the following headings:
1. Effects of the latching current and after-pulse
2. Embodiment
3. Variations
4. Usage examples of the imaging system 1. Effects of the Latching Current and After-Pulse Described briefly below with reference to FIGS. 1 to 12 are the effects of the latching current and after-pulse in the case where distance is measured using the SPAD.

Figure 1:
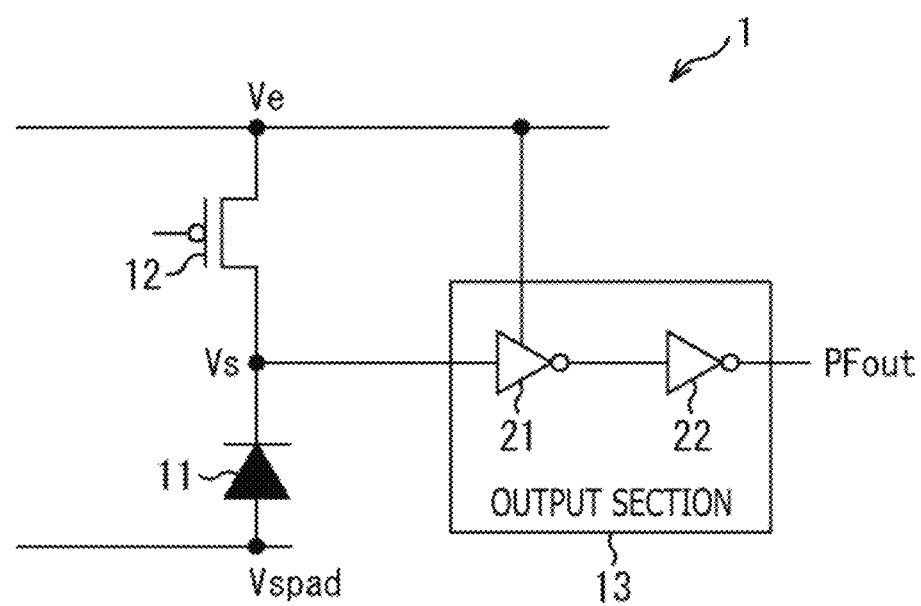
FIG. 1 is a circuit diagram depicting a configuration example of a pixel using an SPAD.

FIG. 1 depicts a configuration example of a pixel 1 in an imaging element that measures distance by the ToF (Time of Flight) method using the SPAD.

The pixel 1 includes an SPAD 11, a transistor 12 made of a P-type MOSFET, and an output section 13. The output section 13 includes inverters 21 and 22.

The cathode of the SPAD 11 is connected with the source of the transistor 12 and with the input terminal of the inverter 21. The anode of the SPAD 11 is connected with a power source Vspad (not depicted). The drain of the transistor 12 is connected with a power source Ve (not depicted). The output terminal of the inverter 21 is connected with the input terminal of the inverter 22. The inverter 21 is supplied with an operating voltage from the power source Ve.

The drain of the transistor 12 is set to a positive potential Ve by the power source Ve, for example. The anode of the SPAD 11 is set to a negative potential Vspad by the power source Vspad, for example. The power source Ve and the power source Vspad apply a reverse voltage equal to or higher than a breakdown voltage Vbd to the SPAD 11, putting the SPAD 11 in Geiger mode. When a photon enters the SPAD 11 in Geiger mode, avalanche multiplication occurs and a current flows through the SPAD 11.

The transistor 12, which is a current source operating in a saturation region, works as a quenching resistance that performs passive quenching. That is, when avalanche amplification occurs in the SPAD 11 causing a current to flow therethrough, a current also flows through the transistor 12 causing its resistance component to produce a voltage drop. This lowers the cathode potential Vs of the SPAD 11. When the voltage applied to the SPAD 11 becomes equal to or lower than the breakdown voltage Vbd, avalanche multiplication stops. Thereafter, the carriers accumulated in the SPAD 11 by avalanche multiplication are discharged through the transistor 12. This allows the cathode potential Vs to recover to a level near the initial potential Ve, setting the SPAD 11 again to Geiger mode.

The output section 13 outputs a light reception signal PFout indicating a photon being incident on the SPAD 11.

Specifically, when the input voltage is equal to or higher than a predetermined threshold voltage Vth, the inverter 21 outputs a predetermined Low-level voltage. When the input voltage is lower than the threshold voltage Vth, the inverter 21 outputs a predetermined High-level voltage. Thus when a photon enters the SPAD 11 producing avalanche multiplication that in turn causes the cathode potential Vs to drop below the threshold voltage Vth, the output voltage of the inverter 21 is inverted from Low to High. On the other hand, when avalanche multiplication in the SPAD 11 stops and the cathode potential Vs rises to become equal to or higher than the threshold potential Vth, the output voltage of the inverter 21 is inverted from High to Low.

The inverter 22 outputs the light reception signal PFout by inverting and outputting the output voltage of the inverter 21. Therefore the light reception signal PFout is a Low-active pulse signal. That is, when a photon entering the SPAD 11 produces avalanche multiplication, i.e., when photon incidence is detected by the SPAD 11, the Low-level pulse type light reception signal PFout indicating a photon incident on the SPAD 11 is output.

Figure 2:
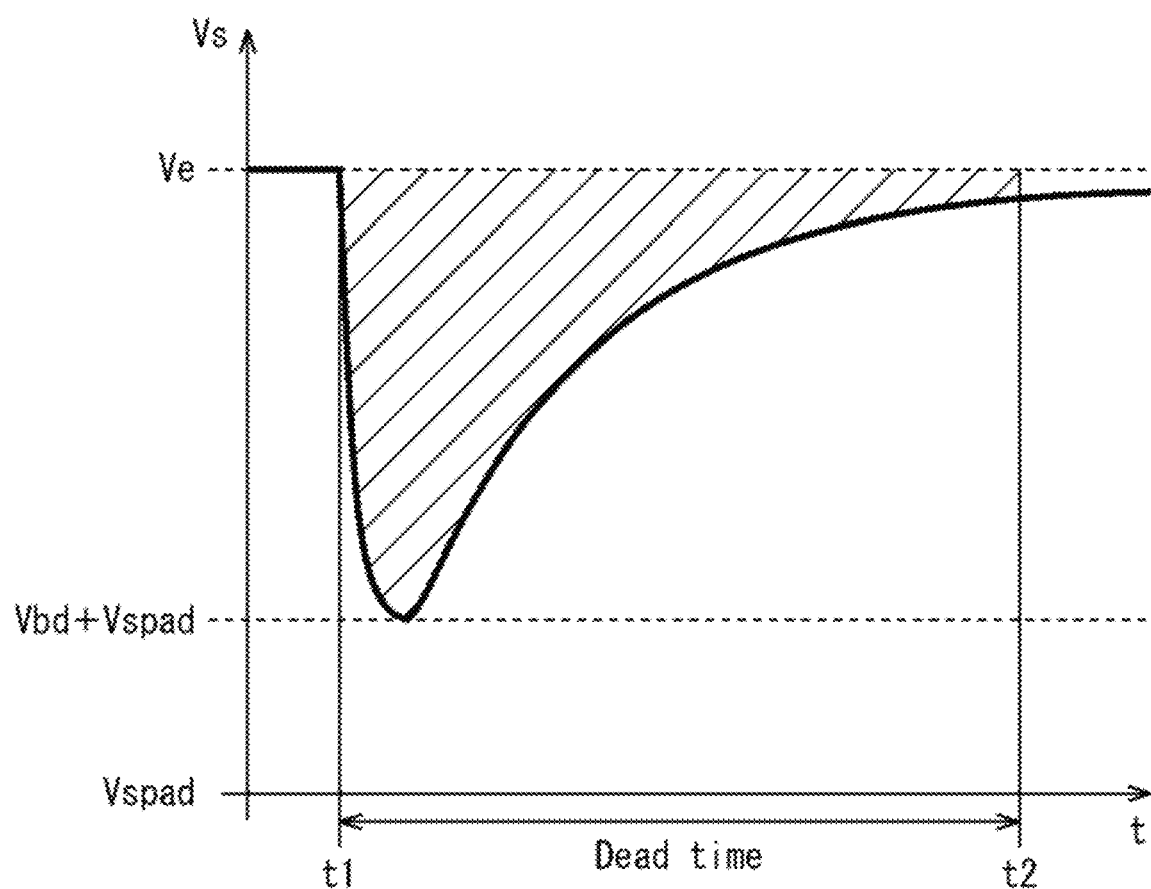
FIG. 2 is a graph depicting exemplary cathode potential characteristics.

FIG. 2 depicts exemplary characteristics of the cathode potential Vs of the pixel 1.

Before time t1, the cathode potential Vs is approximately equal to the potential Ve. With a reverse voltage equal to or higher than the breakdown voltage Vbd applied to the SPAD 11, the SPAD 11 is set to Geiger mode.

At time t1, a photon entering the SPAD 11 produces avalanche multiplication causing a current to flow through the SPAD 11. This in turn causes a current to flow through the transistor 12, producing a voltage drop and lowering the cathode potential Vs. When the cathode potential Vs drops to the breakdown voltage Vbd plus the potential Vspad, with the applied voltage of the SPAD 11 reaching the breakdown voltage Vbd, avalanche multiplication stops. Thereafter, the carriers accumulated in the SPAD 11 by avalanche multiplication are discharged through the transistor 12. This causes the cathode voltage Vs to rise gradually and recover ultimately to the potential Ve.

The period from time t1 at which a photon enters the SPAD 11 until time t2 at which the cathode potential Vs recovers to a level near the potential Ve is the dead time in which the SPAD 11 cannot detect photon incidence. The shorter the dead time is, the larger the number of photons detected and the higher the accuracy of distance measurement performed with the pixel 1 as a result.

Figure 3:
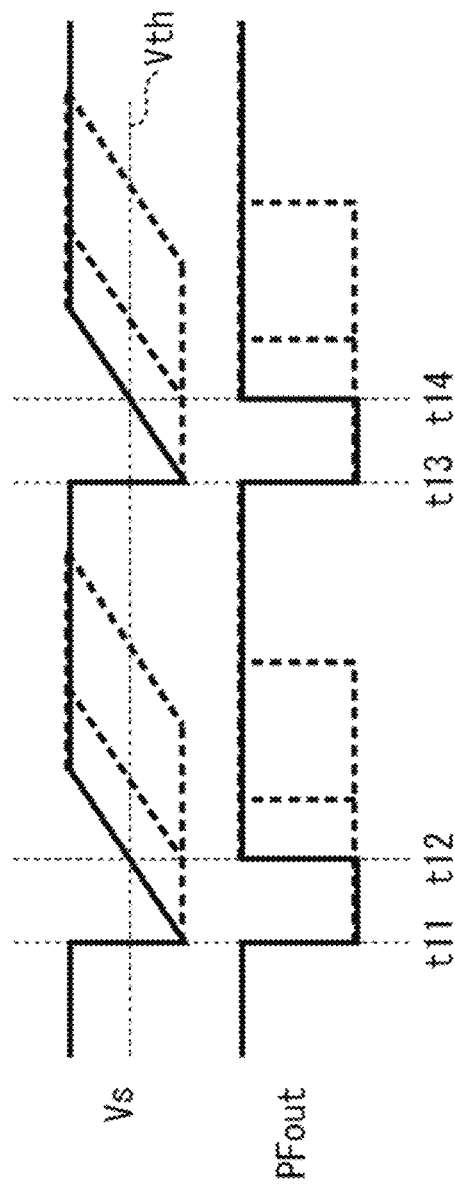
FIG. 3 is a graph schematically depicting relations between cathode potential and a light reception signal.

FIG. 3 schematically depicts relations between the cathode potential Vs of the pixel 1 and the light reception signal PFout.

At time t11, a photon enters the SPAD 11, producing avalanche multiplication therein and lowering the cathode potential Vs. When the cathode potential Vs drops below the threshold voltage Vth, the output voltage of the inverter 21 is inverted from Low to High and the output voltage of the inverter 22 is inverted from High to Low. That is, the inverter 22 outputs the Low-active light reception signal PFout.

Then ideally, the cathode potential Vs rapidly starts to recover as indicated by solid line. At time t12 when the cathode potential Vs reaches the threshold voltage Vth, the output voltage of the inverter 21 is inverted from High to Low and the output voltage of the inverter 22 is inverted from Low to High. That is, the output of the Low-active light reception signal PFout from the inverter 22 is stopped.

Thereafter, the cathode potential Vs recovers to a level near the potential Ve, the SPAD 311 is again set to Geiger mode, and the dead time comes to an end. Then as indicated at time t13 and at time t14, similar operations are repeated every time a photon enters the SPAD 11.

However, as indicated by broken lines in the drawing, the cathode potential Vs may be slow to recover, the pulse width of the light reception signal PFout may be widened, and the dead time of the SPAD 11 may be prolonged due to the effects of a latching current and an after-pulse of the SPAD 11, as will be discussed later. This leads to a drop in a count rate (i.e., the frequency of continuous readout). As a result, the accuracy of distance measurement by the pixel 1 worsens.

Explained below with reference to FIGS. 4 to 9 is the effect of the latching current of the SPAD 11.

Figure 4:
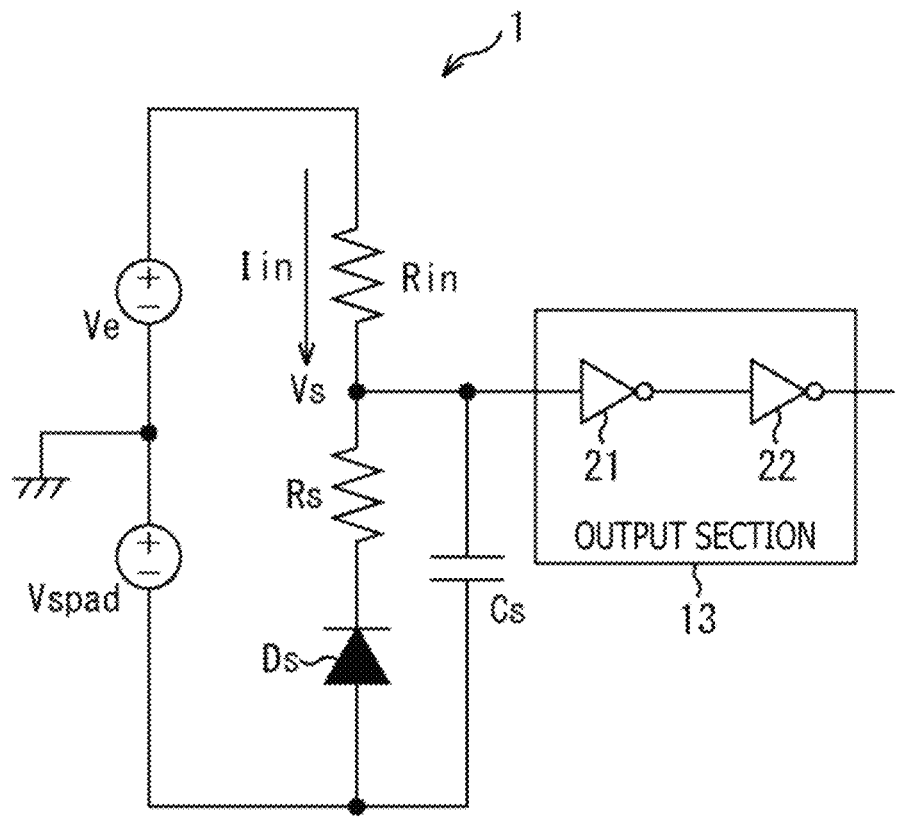
FIG. 4 is a circuit diagram depicting an equivalent circuit of the pixel in FIG. 1.

FIG. 4 depicts an equivalent circuit of the pixel 1 in FIG. 1. In this equivalent circuit, the SPAD 11 is represented by a diode element Ds, an internal resistance Rs, and a parasitic capacitance Cs. The transistor 12 is represented by a resistance Rin.

The cathode of the diode element Ds is connected with the resistance Rin and with the input terminal of the inverter 21 via the internal resistance Rs. The anode of the diode element Ds is connected with the negative terminal of the power source Vspad. The parasitic capacitance Cs is connected interposingly between the input terminal of the inverter 21 and the anode of the diode element Ds. The positive terminal of the power source Ve is connected with the input terminal of the inverter 21 via the resistance Rin. The negative terminal of the power source Ve is connected to ground. The positive terminal of the power source Vspad is connected to ground.

For the purpose of simplification, explained below is the case where the voltage Vspad of the power source Vspad is equal to the breakdown voltage Vbd of the diode element Ds. Thus the anode potential of the diode element Ds is −Vbd.

Figure 5:
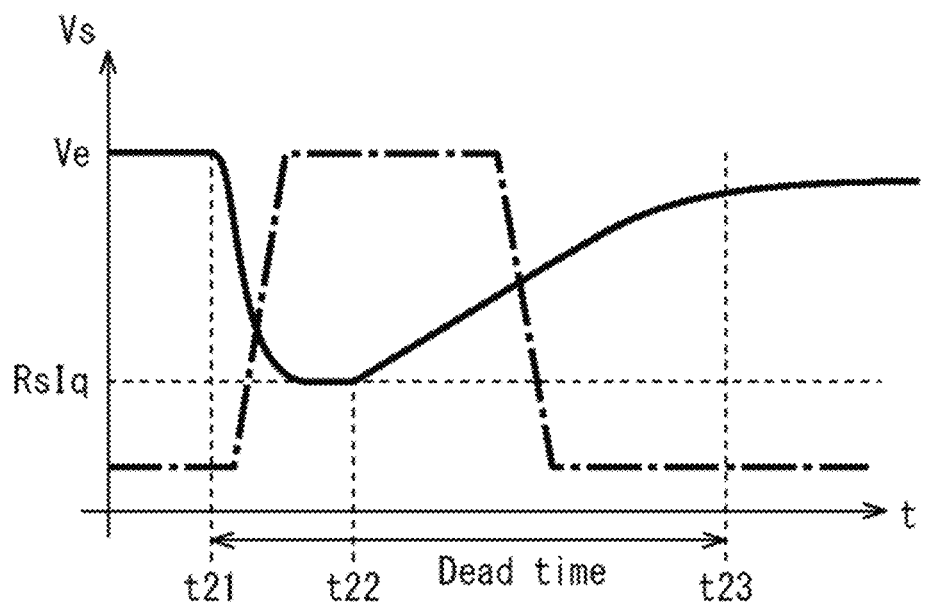
FIG. 5 is a graph depicting exemplary cathode potential characteristics in the case where an input current is smaller than a latching current.
Figure 6:
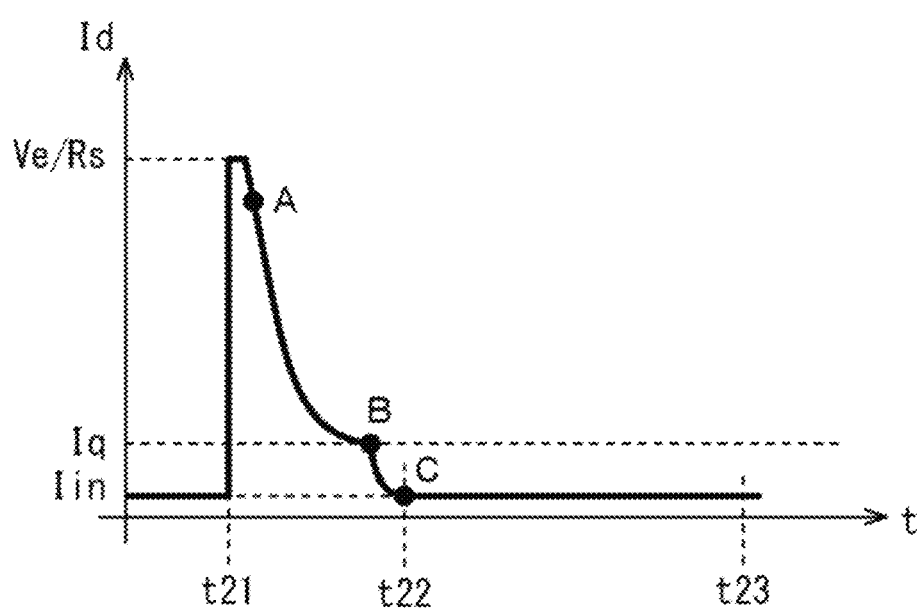
FIG. 6 is a graph depicting exemplary SPAD current characteristics in the case where the input current is smaller than the latching current.

FIG. 5 depicts exemplary characteristics of the cathode potential Vs in the case where an input current Iin (=Ve/(Rin+Rs)) input to the SPAD 11 via the resistance Rin is smaller than a latching current Iq of the SPAD 11. FIG. 5 also has an output voltage waveform of the inverter 21 indicated by dashed lines. FIG. 6 depicts exemplary characteristics of a current Id flowing through the diode element Ds in the case where the input current Iin is smaller than the latching current Iq.

At time t21, a photon entering the diode element Ds produces avalanche multiplication in the diode element Ds and causes a current to flow therethrough. This in turn causes a current to flow through the resistance Rin, producing a voltage drop and lowering the cathode potential Vs. At this point, the current Id flowing through the diode element Ds is maximized to reach Ve/Rs. Thereafter, with the cathode potential Vs getting lowered, the current Id diminishes.

Figure 7:
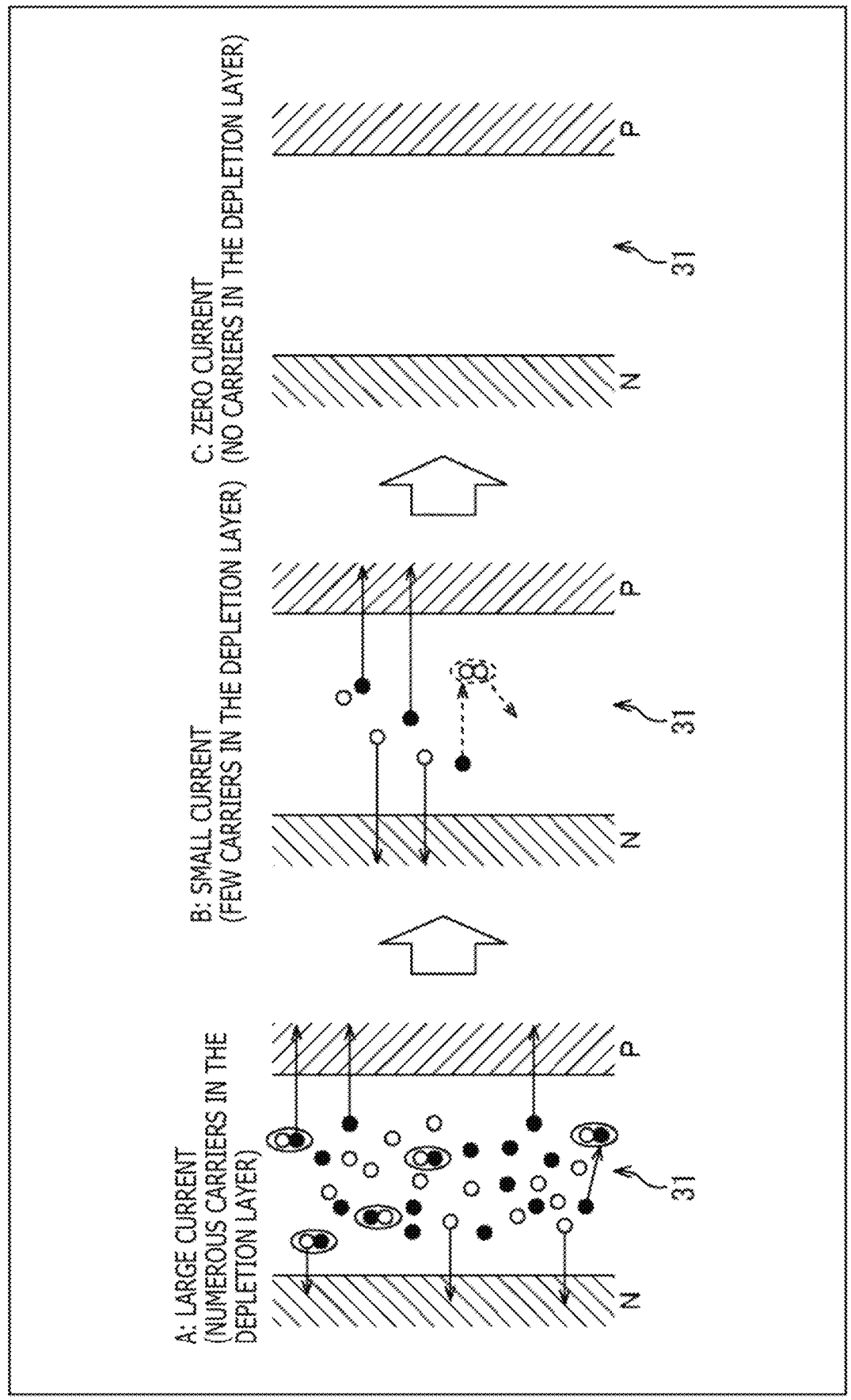
FIG. 7 is a schematic diagram schematically depicting changes of carriers in a depletion layer of the SPAD.

Subfigure A in FIG. 7 schematically depicts what takes place in a depletion layer 31 of the diode element Ds at a time when the current Id reaches a point A in FIG. 6. Hollow circles in Subfigure A represent positive carriers (holes) and solid circles denote negative carriers (electrons). As illustrated, when the current Id reaches the point A, there are numerous carriers in the depletion layer 31.

Thereafter, in the case where the input current Iin becomes smaller than the latching current Iq, the current Id reaches the latching current Iq as depicted in FIG. 6.

Subfigure B in FIG. 7 schematically depicts what takes place in the depletion layer 31 of the diode element Ds at a time when the current Id reaches a point B in FIG. 6, i.e., when the current Id reaches the latching current Iq. As illustrated, there are very few carriers in the depletion layer 31 when the current Id reaches the latching current Iq. In this case, there are very few carriers that would produce impact ionization, so that avalanche multiplication stops. As depicted in Subfigure C of FIG. 7, there is practically no carrier in the depletion layer 31, raising the impedance of the diode element Ds to a very high level. The current Id then abruptly drops to become approximately equal to the input current Iin as indicated by a point C at time t22 in FIG. 6. At this point, the cathode potential Vs becomes approximately equal to the resistance Rs multiplied by the latching current Iq.

Thereafter, the carriers accumulated in the parasitic capacitance Cs by avalanche multiplication are discharged through the transistor 12. This causes the cathode potential Vs to recover to a level near the initial potential Ve. At time t23, the dead time comes to an end.

Here, a time constant τ indicative of the speed at which the cathode potential Vs recovers is represented by the resistance Rin multiplied by the parasitic capacitance Cs. Thus the higher the resistance Rin becomes, the smaller the input current Iin, which slows the recovery speed of the cathode potential Vs. As a result, the dead time of the SPAD 11 is prolonged.

In contrast, the lower the resistance Rin is, the larger the input current Iin, which raises the recovery speed of the cathode potential Vs. As a result, the dead time of the SPAD 11 is shortened. When the input current Iin becomes larger than the latching current Iq, however, the dead time is prolonged.

Figure 8:
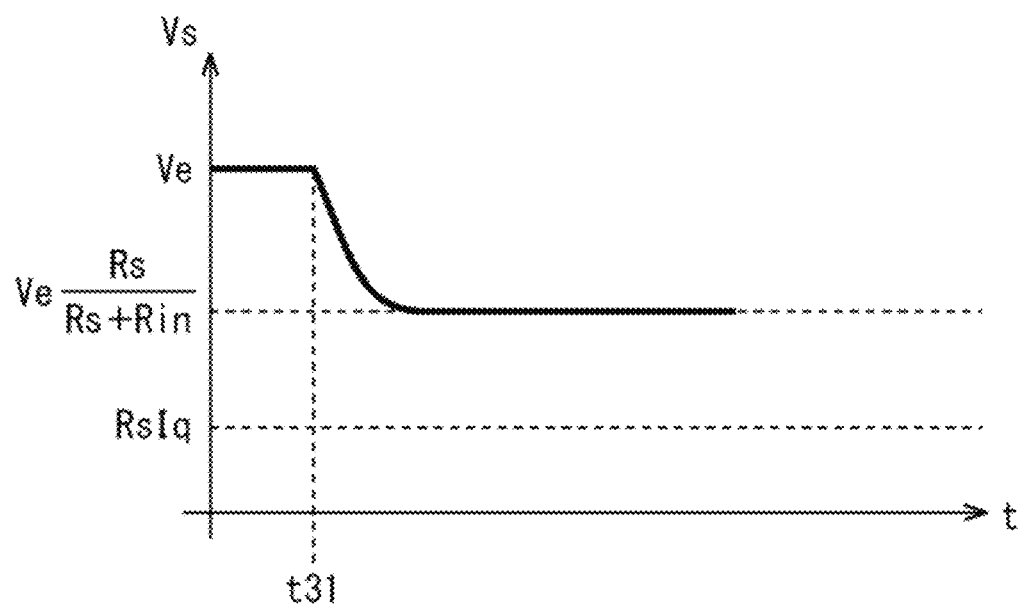
FIG. 8 is a graph depicting exemplary cathode potential characteristics in the case where the input current is larger than the latching current.
Figure 9:
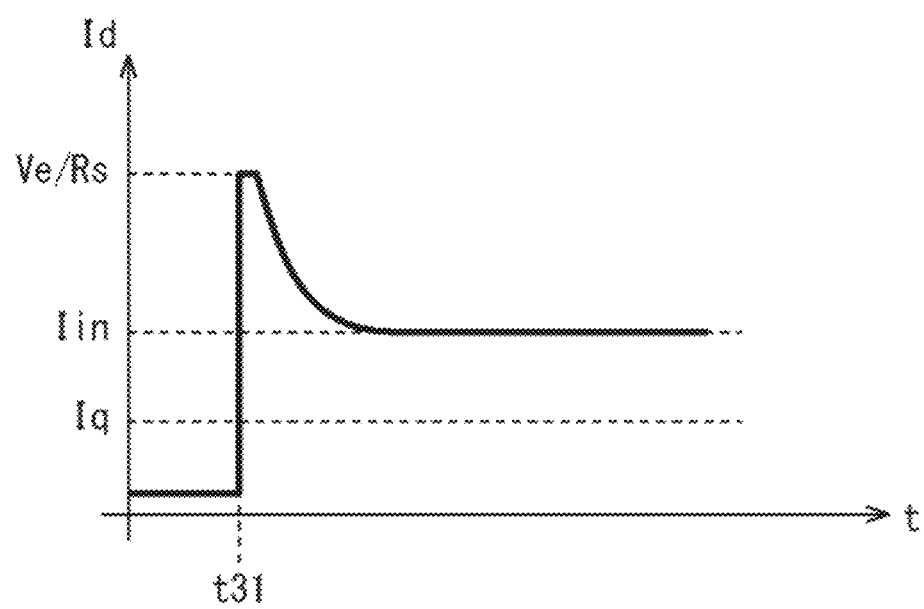
FIG. 9 is a graph depicting exemplary SPAD current characteristics in the case where the input current is larger than the latching current.

FIG. 8 depicts exemplary characteristics of the cathode potential Vs in the case where the input current Iin is larger than the latching current Iq. FIG. 9 depicts exemplary characteristics of the current Id in the case where the input current Iin is larger than the latching current Iq.

At time t31, a photon entering the diode element Ds produces avalanche multiplication, lowering the cathode potential Vs as at time T21 in the case of FIG. 5. At this point, the current Id flowing through the diode element Ds is maximized to reach Ve/Rs.

Thereafter, a decrease in the cathode potential Vs entails a drop in the current Id. With the input current Iin larger than the latching current Iq, the current Id becomes approximately equal to the input current Iin but does not decrease from there. The current Id thus does not reach the latching current Iq. For this reason, a state continues in which there are numerous carriers in the depletion layer 31 of the diode element Ds. With avalanche multiplication slow to stop, a state continues in which the cathode potential Vs is approximately equal to Ve×(Rs/(Rs+Rin)). Thus it takes time for the cathode potential Vs to recover to the potential Ve. Consequently the dead time of the SPAD 11 is prolonged and varied.

With the pixel 1, as described above, it is necessary to make the input current Iin smaller than the latching current Iq of the SPAD 11. However, making the input current Iin too small delays the recovery of the cathode potential Vs and prolongs the dead time.

Figure 10:
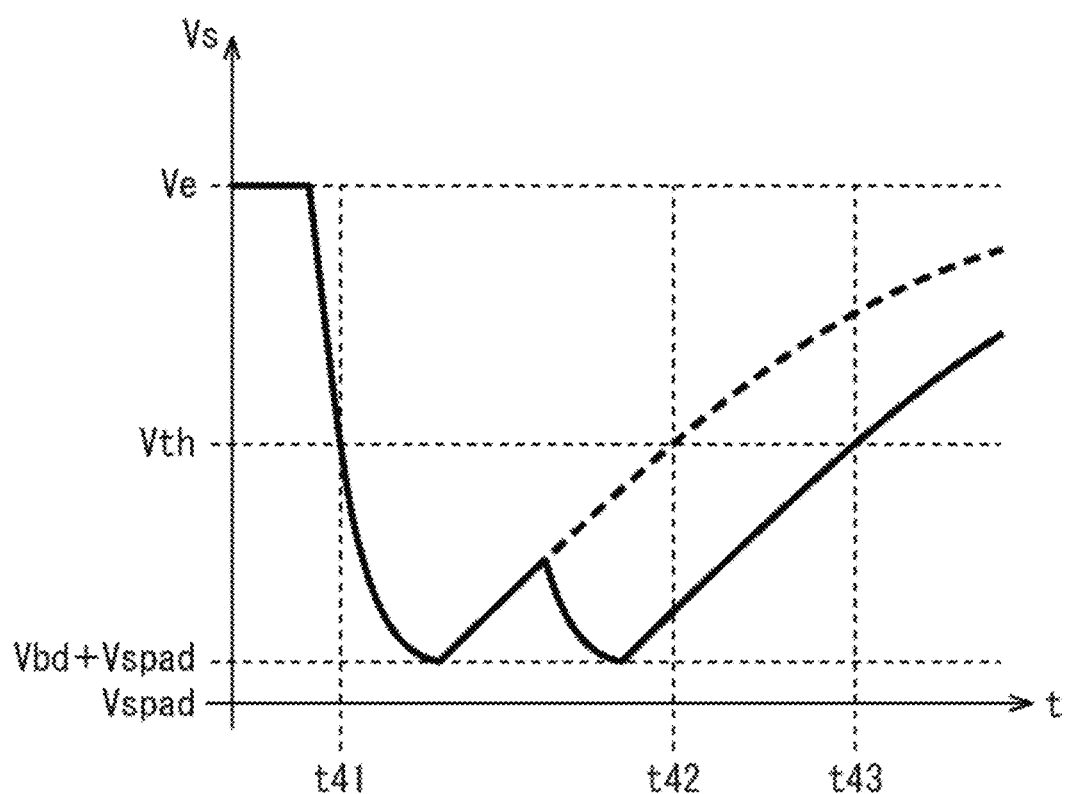
FIG. 10 is a graph depicting exemplary cathode potential characteristics in the case where an after-pulse occurs.
Figure 11:
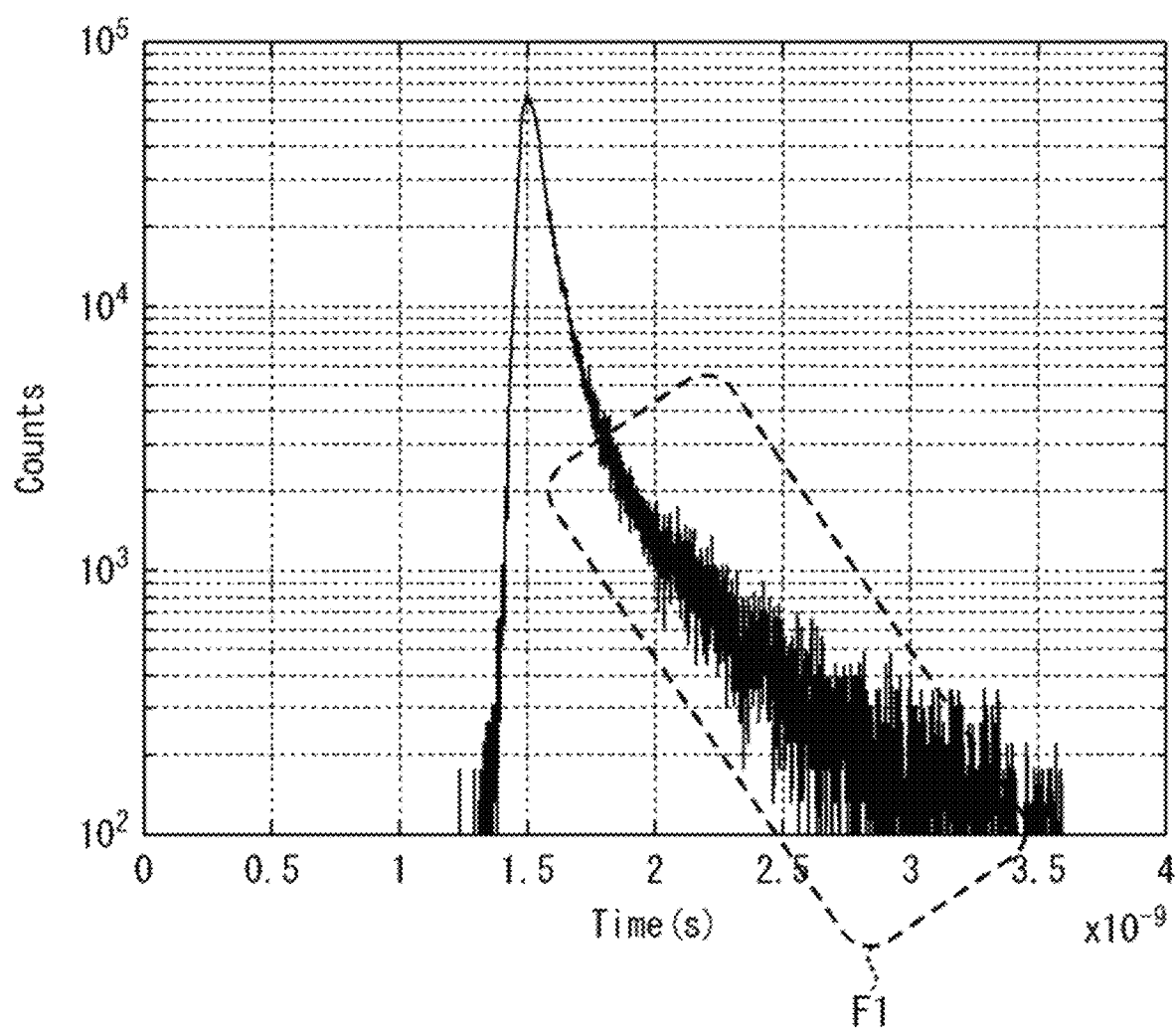
FIG. 11 is a graph depicting an exemplary distribution of pulse counts of the light reception signal in the time direction.
Figure 12:
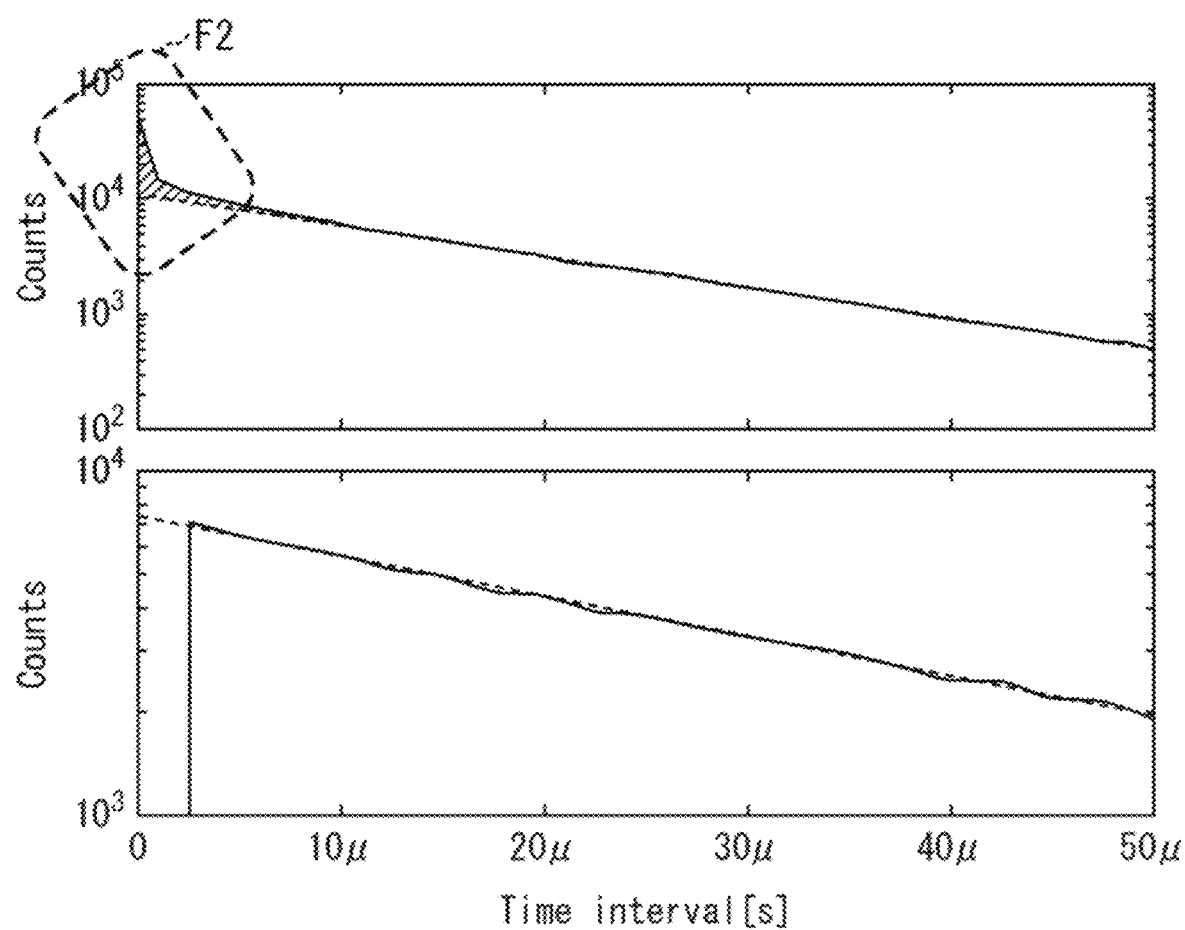
FIG. 12 is a graph depicting an exemplary distribution of time intervals between adjacent pulses of the light reception signal.

Explained next with reference to FIGS. 10 to 12 is the effect of the after-pulse in the SPAD 11.

FIG. 10, as with FIG. 2, depicts exemplary characteristics of the cathode potential in the pixel 1.

At time t41, a photon entering the SPAD 11 produces avalanche multiplication and lowers the cathode potential Vs.

When the cathode potential Vs drops to the breakdown voltage Vbd plus the potential Vspad, with the applied voltage of the SPAD 11 reaching the breakdown voltage Vbd, avalanche multiplication stops. Thereafter, the cathode potential Vs starts to recover but, upon generation of an after-pulse, avalanche multiplication again occurs and the cathode potential Vs again decreases. When the cathode potential Vs drops to the breakdown voltage Vbd plus the potential Vspad, with the anode-to-cathode voltage of the SPAD 11 reaching the breakdown voltage Vbd, avalanche multiplication stops and the cathode potential Vs again starts to recover.

Thus, if an after-pulse is not generated, the cathode potential Vs recovers to the threshold voltage Vth at time t42. If an after-pulse is generated, the recovery of the cathode potential Vs up to the threshold voltage Vth is delayed until time t43. Obviously, generation of the after-pulse also prolongs the dead time.

Although FIG. 10 depicts an example in which an after-pulse is generated during the dead time, an after-pulse may also occur after the cathode potential Vs recovers to a level near the potential Ve and the dead time comes to an end. In this case, avalanche multiplication occurs despite the absence of photon incidence on the SPAD 11. The cathode potential Vs then drops below the threshold voltage Vth and the light reception signal PFout is output. That is, a photon is erroneously detected.

FIG. 11 depicts exemplary output characteristics of the light reception signal PFout from the pixel 1. Specifically, the horizontal axis of the drawing represents the elapsed time since emission of irradiation light for the measurement of distance. The vertical axis of the drawing denotes pulse counts indicative of the number of pulses of the light reception signal PFout. That is, FIG. 11 illustrates an exemplary distribution of pulse counts of the light reception signal PFout in the time direction.

In this example, approximately at $1.5 \times 10^{-9}$ seconds, the number of pulses of the light reception signal PFout is maximized. Thus it is estimated that there exists a certain object at a point in time that has elapsed $(1.5 \times 10^{-9})/2$ seconds since the emission of irradiation light.

Meanwhile, after the number of pulses of the light reception signal PFout is maximized approximately at $1.5 \times 10^{-9}$ seconds, the pulse count does not diminish smoothly but repeatedly rises and falls conspicuously, as indicated by a broken-line rectangle F1 of FIG. 11. This is primarily attributable to the generation of an after-pulse after the dead time leading to erroneous output of the light reception signal PFout despite the absence of photon incidence on the SPAD 11.

Incidentally, the probability of after-pulse generation is dependent on the concentration of carriers in the depletion layer of the SPAD 11. Thus the probability of after-pulse generation is maximized immediately after a photon entering the SPAD 11 has produced avalanche multiplication. Thereafter, the probability of after-pulse generation decreases exponentially over time. Thus the higher the recovery speed of the cathode potential Vs becomes after the large input current Iin has caused avalanche multiplication to stop, the more likely the after-pulse is to be generated.

FIG. 12 illustrates other exemplary output characteristics of the light reception signal PFout of the pixel 1. More specifically, FIG. 12 depicts an exemplary distribution of time intervals between adjacent pulses of the light reception signal PFout. The horizontal axis of the upper and the lower graphs in FIG. 12 represents time intervals between adjacent pulses of the light reception signal PFout. The vertical axis of the two graphs denotes counts totaling the pulse-to-pulse time intervals. The upper graph depicts a distribution of time intervals between adjacent pulses of the light reception signal PFout in the case where large quantities of after-pulses are generated. The lower graph illustrates a distribution of time intervals between adjacent pulses of the light reception signal PFout in the case where small quantities of after-pulses are generated. Further, broken-line waveforms in the upper and the lower graphs indicate an ideal gradient of a graphic distribution of time intervals between adjacent pulses of the light reception signal PFout.

In the case where small quantities of after-pulses are generated, the count of pulse-to-pulse time intervals of the light reception signal PFout is maximized approximately at 100 ns, for example. This point in time is estimated to be near the dead time of the SPAD 11. The count is approximately zero at less than 100 ns. At 100 ns or later, the count decreases in an approximately linear manner.

On the other hand, in the case where large quantities of after-pulses are generated, the count is higher at less than 100 nm than at 100 nm. As indicated by a broken-line rectangle F2, the count increases exponentially as the time intervals are progressively shortened. The increase is estimated to be attributable to the numerous after-pulses getting generated to trigger the output of the light reception signal PFout immediately after the end of the dead time despite the absence of photon incidence on the SPAD 11.

2. Embodiment

An embodiment of the present technology s explained below with reference to FIGS. 13 to 18.

<Configuration Example of the Imaging System>

Figure 13:
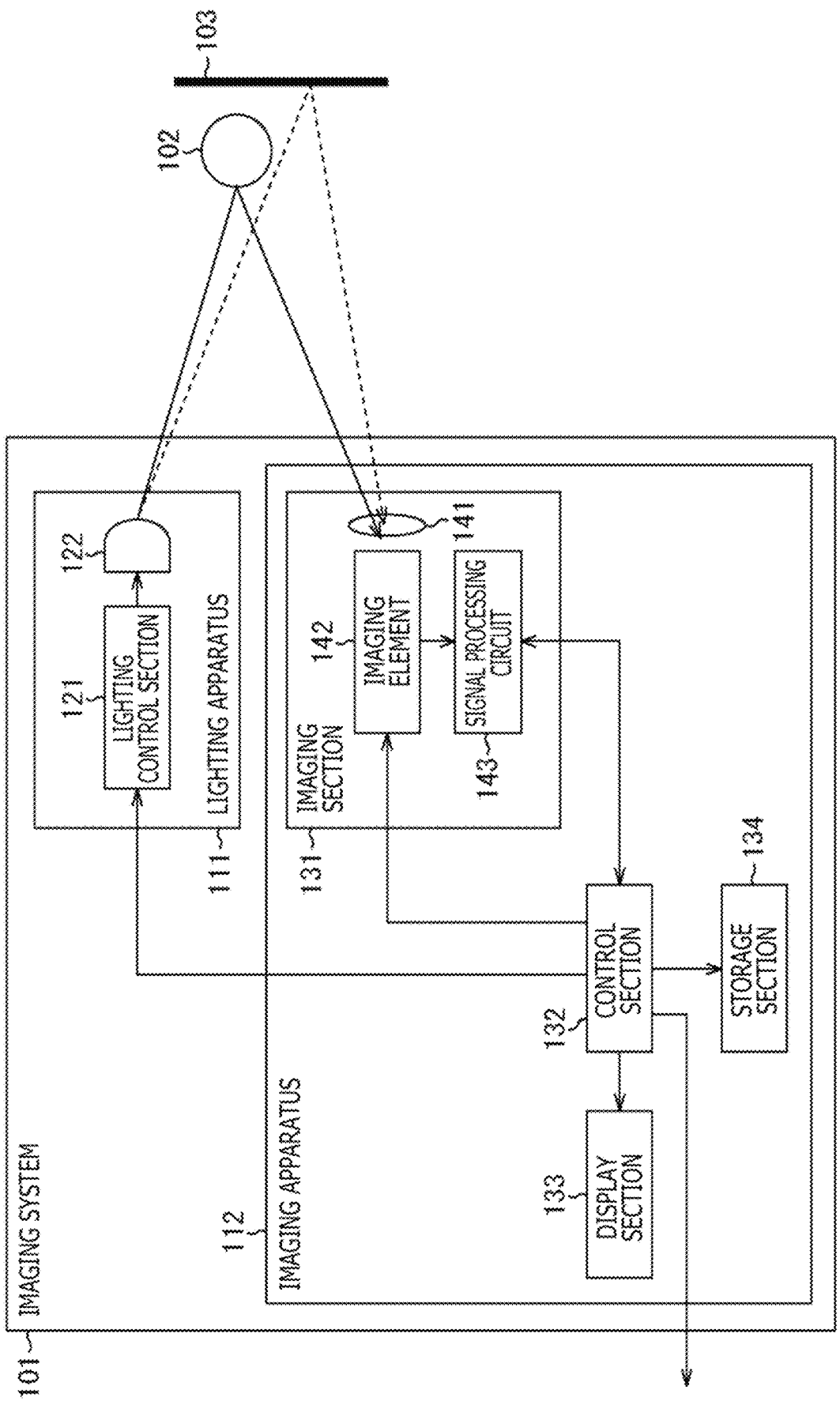
FIG. 13 is a block diagram depicting an embodiment of an imaging system to which the present technology is applied.

FIG. 13 is a block diagram depicting an imaging system 101 as an embodiment of the present technology. The imaging system 101 captures range images using the ToF method, for example. Here, a range image is made of range pixel signals based on the distance, detected by each pixel, of an object away from the imaging system 101 in the depth direction.

The imaging system 101 includes a lighting apparatus 111 and an imaging apparatus 112.

The lighting apparatus 111 includes a lighting control section 121 and a light source 122.

The lighting control section 121 controls patterns in which the light source 122 emits irradiation light under control of a control section 132 in the imaging apparatus 112. Specifically, the lighting control section 121 controls the pattern in which the light source 122 emits irradiation light in accordance with an irradiation code included in an irradiation signal supplied from the control section 132. For example, the irradiation code is made up of two values, 1 (High) and 0 (Low). When the value of the irradiation code is 1, the lighting control section 121 turns on the light source 122. When the value of the irradiation code is 0, the lighting control section 121 turns off the light source 122.

The light source 122 emits light of a predetermined wavelength band (irradiation light) under control of the lighting control section 121. The light source 122 is constituted by an infrared laser diode, for example. Incidentally, the type of the light source 122 and the wavelength band of the irradiation light may be set as desired in keeping with the purpose of the imaging system 101.

The imaging apparatus 112 receives reflected light that is the irradiation light being reflected by objects 102 and 103, for example. The imaging apparatus 112 includes an imaging section 131, a control section 132, a display section 133, and a storage section 134.

The imaging section 131 includes a lens 141, an imaging element 142, and a signal processing circuit 143.

The lens 141 forms an image of incident light on an imaging plane of the imaging element 142. The lens 141 may be configured as desired. For example, the lens 141 may be configured with multiple groups of lenses.

The imaging element 142 is configured, for example, with a CMOS (Complementary Metal Oxide Semiconductor) image sensor that uses SPADs. Under control of the control section 132, the imaging element 142 captures images of the objects 102 and 103, and supplies a pixel signal obtained from the capture to the signal processing circuit 143. The pixel signal is formed by the light reception signal PFout output from each pixel, for example.

The signal processing circuit 143 under control of the control section 132 processes the pixel signals supplied from the imaging element 142. For example, on the basis of the pixel signal from the imaging element 142, the signal processing circuit 143 detects the distance to the object per pixel to generate a range image indicating the distance from each pixel to the object. Specifically, a timer included in the signal processing circuit 143 measures multiple times (e.g., thousands to tens of thousands of times) a time period required by each pixel of the imaging element 142 to receive light following the emission of light from the light source 122. The signal processing circuit 143 prepares a histogram corresponding to the measured times. By detecting a peak of the histogram, the signal processing circuit 143 determines the time required for the light irradiated from the light source 122 to return after being reflected by the object 102 or 103. Furthermore, the signal processing circuit 143 performs calculations to obtain the distance to the object on the basis of the determined time and the speed of light. The signal processing circuit 143 supplies the range image thus generated to the control section 132.

The control section 132 is configured, for example, with a control circuit and a processor such as an FPGA (Field Programmable Gate Array) and a DSP (Digital Signal Processor). The control section 132 controls the lighting control section 121, imaging element 142, and signal processing circuit 143. Specifically, the control section 132 supplies the timer of the lighting control section 121 with a signal to start the measurement of time while simultaneously feeding an irradiation signal to the lighting control section 121. In response to the irradiation signal, the light source 122 emits irradiation light. The timer starts to measure time in accordance with the signal for starting time measurement, and stops measuring time when receiving the pixel signal supplied from the imaging element 142 upon receipt of irradiation light. Further, the control section 132 supplies the display section 133 with the range image acquired from the imaging section 131, causing the display section 133 to display the range image. Moreover, the control section 132 stores the range image acquired from the imaging section 131 into the storage section 134. Also, the control section 132 outputs the range image acquired from the imaging section 131 to the outside.

The display section 133 is configured, for example, with a panel type display apparatus such as a liquid crystal display apparatus or an organic EL (Electro Luminescence) display apparatus.

The storage section 134 may be configured with a suitable storage apparatus and a storage medium and stores range images, for example.

<Configuration Example of the Imaging Element 142>

Figure 14:
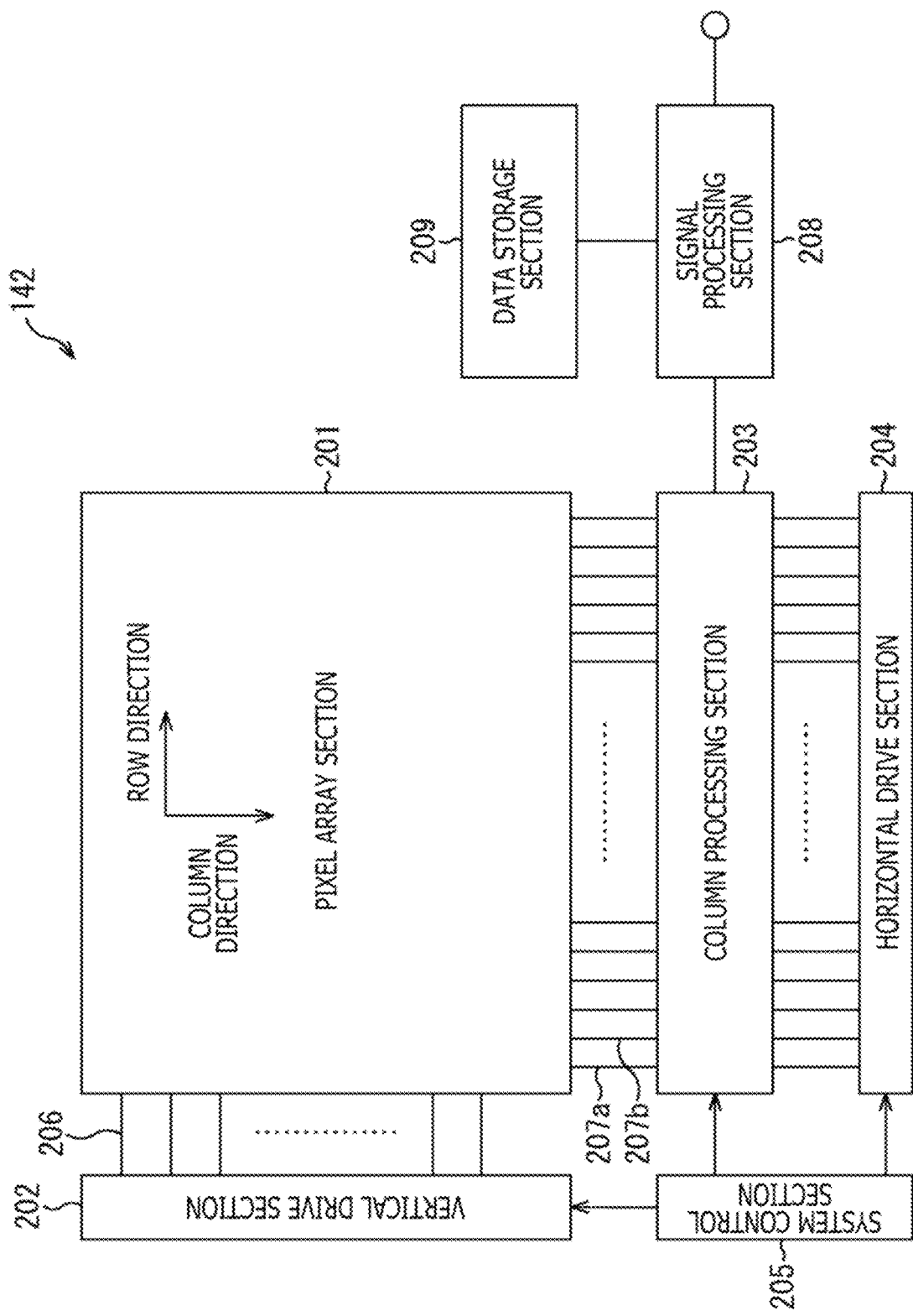
FIG. 14 is a block diagram depicting a configuration example of an imaging element.

FIG. 14 depicts a configuration example of the imaging element 142.

The imaging element 142 includes a pixel array section 201, a vertical drive section 202, a column processing section 203, a horizontal drive section 204, a system control section 205, pixel drive lines 206, vertical signal lines 207, a signal processing section 208, and a data storage section 209.

The pixel array section 201 is configured with multiple pixels that detect incident photons and output pixel signals indicative of the result of the detection. The pixels constituting the pixel array section 201 are arrayed horizontally (in the row direction) and vertically (in the column direction) in the drawing, for example.

In the pixel array section 201, for example, each row of pixels arrayed in the row direction is wired with a pixel drive line 206, and each column of pixels arrayed in the column direction is wired with a vertical signal line 207.

The vertical drive section 202 is configured with a shift register and an address decoder, for example. The vertical drive section 202 supplies the pixels with signals via multiple pixel drive lines 206. In so doing, the vertical drive section 202 drives all pixels of the pixel array section 201 either simultaneously or in units of rows, for example.

The column processing section 203 reads signals from each column of pixels in the pixel array section 201 via the vertical signal lines 207. The column processing section 203 then generates pixel signals by performing such processes as noise rejection, correlated double sampling, and A/D (Analog to Digital) conversion.

The horizontal drive section 204 is configured with a shift register and an address decoder, for example. The horizontal drive section 204 selects, in turn, unit circuits in the column processing section 203 corresponding to the pixel columns. A selection scan by the horizontal drive section 204 causes the pixel signal processed by each unit circuit in the column processing section 203 to be output sequentially to the signal processing section 208.

The system control section 205 is configured with a timing generator that generates various timing signals, for example. On the basis of the timing signals generated by the timing generator, the system control section 205 performs drive control of the vertical drive section 202, column processing section 203, and horizontal drive section 204.

The signal processing section 208 temporarily stores data into the data storage section 209 as needed. In so doing, the signal processing section 208 performs signal processing such as arithmetic processing on the pixel signals supplied from the column processing section 203 so as to output an image signal made up of the pixel signals.

<Configuration Examples of the Pixel>

Figure 15:
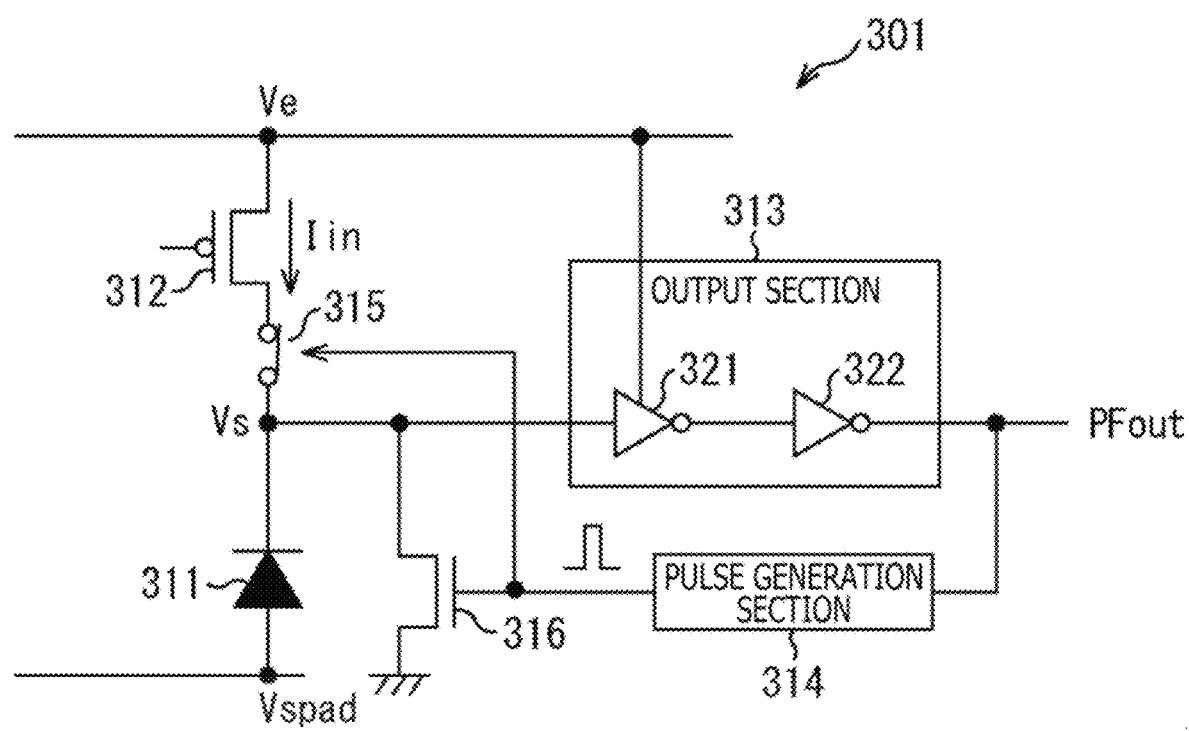
FIG. 15 is a circuit diagram depicting a configuration example of a pixel.
Figure 16:
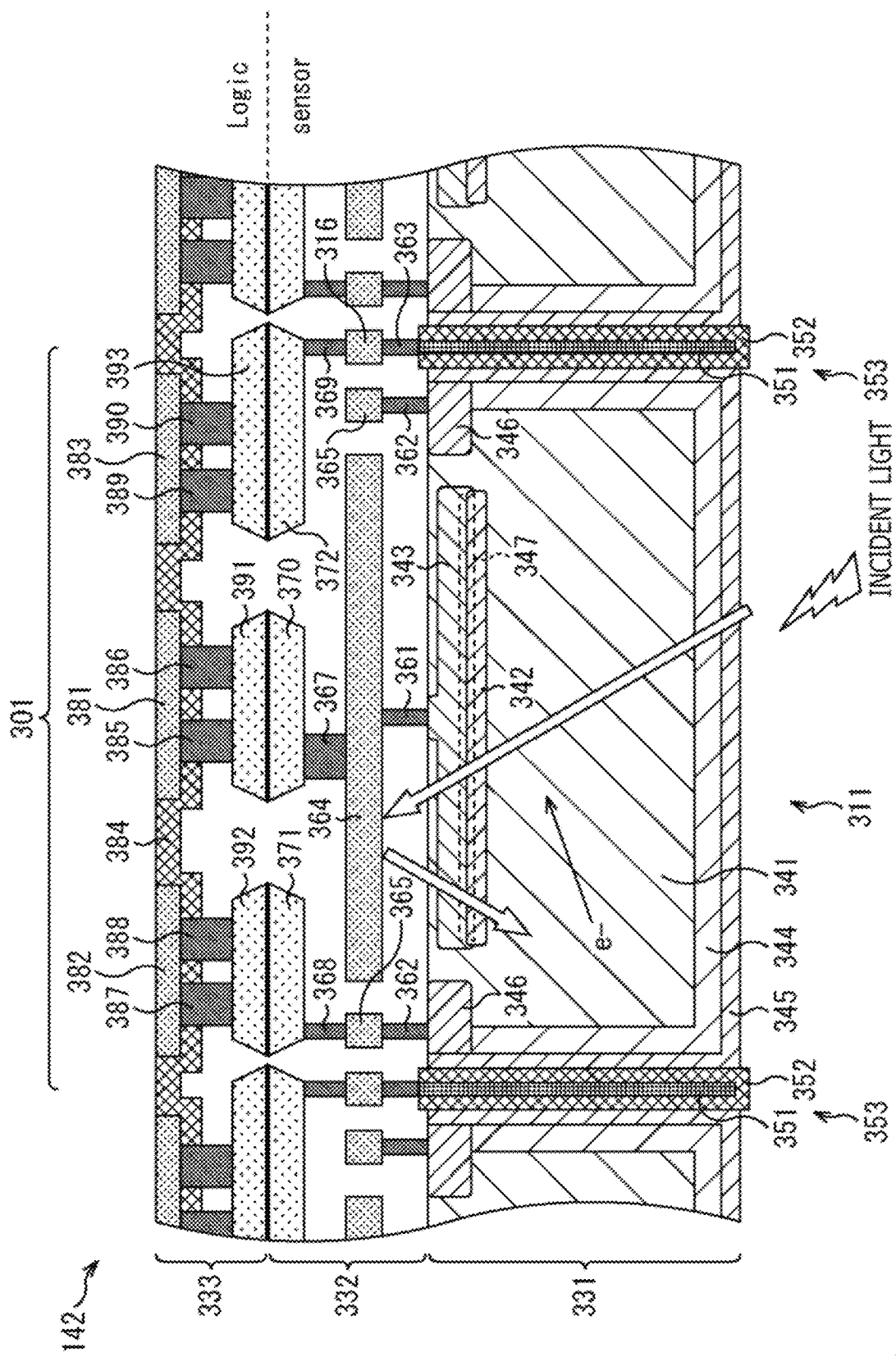
FIG. 16 is a cross-sectional diagram depicting a configuration example of a pixel.
Figure 17:
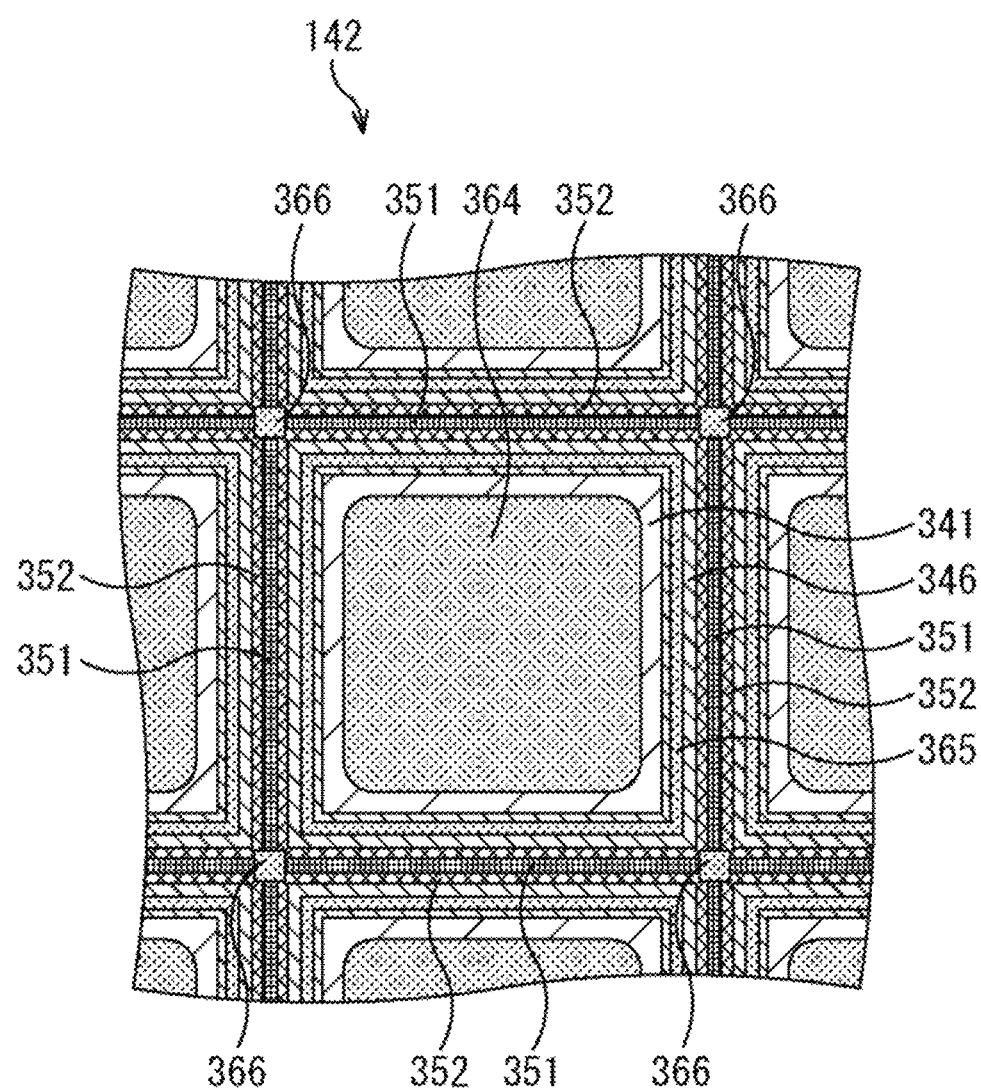
FIG. 17 is a plan view depicting a configuration example of the wiring of a pixel.

FIGS. 15 to 17 depict configuration examples of unit pixels 301 (simply called the pixel 301 hereunder) constituting the pixel array section 201 in the imaging element 142.

FIG. 15 is a circuit diagram depicting a configuration example of the pixel 301. In FIG. 15, the parts corresponding to those of the pixel 1 in FIG. 1 share the same last two digits of their reference numerals.

The pixel 301 includes an SPAD 311, a transistor 312 formed by a P-type MOSFET, an output section 313, a pulse generation section 314, a switch 315, and a transistor 316 constituted by an N-type MOSFET. The output section 313 includes inverters 321 and 322.

The cathode of the SPAD 311 is connected with the source of the transistor 312 via the switch 315, with the input terminal of the inverter 321, and with the drain of the transistor 316. Thus the switch 315 is interposed between the SPAD 311 and the transistor 312. More specifically, the switch 315 is provided interposingly between a branch point from which the signal line from the cathode of the SPAD 311 branches in the direction of the transistor 312 and in the direction of the inverter 321 on one hand, and the transistor 312 on the other hand. The anode of the SPAD 311 is connected with a power source Vspad (not depicted). The drain of the transistor 312 is connected with a power source Ve (not depicted). The output terminal of the inverter 321 is connected with the input terminal of the inverter 322. The inverter 321 is supplied with an operating voltage from the power source Ve. The output terminal of the inverter 322 is connected with the input terminal of the pulse generation section 314. The output terminal of the pulse generation section 314 is connected with the control terminal of the switch 315 and with the gate of the transistor 316. The source of the transistor 316 is connected to ground.

The drain of the transistor 312 is set to a positive potential Ve by the power source Ve, for example. The anode of the SPAD 311 is set to a negative potential Vspad by the power source Vspad, for example. The power source Ve and the power source Vspad apply a reverse voltage equal to or higher than a breakdown voltage Vbd to the SPAD 311, putting the SPAD 311 in Geiger mode. When a photon enters the SPAD 311 in Geiger mode, avalanche multiplication occurs and a current flows through the SPAD 311.

The transistor 312, which is a current source operating in a saturation region, works as a quenching resistance that performs passive quenching. That is, when avalanche amplification occurs in the SPAD 311 causing a current to flow therethrough, a current also flows through the transistor 312 causing its resistance component to produce a voltage drop. This lowers the cathode potential Vs of the SPAD 311. When the voltage applied to the SPAD 311 becomes equal to or lower than the breakdown voltage Vbd, avalanche multiplication stops. Thereafter, the carriers accumulated in the SPAD 311 by avalanche multiplication are discharged through the transistor 312. This allows the cathode potential Vs to recover to a level near the initial potential Ve, setting the SPAD 311 again to Geiger mode.

The output section 313 outputs a light reception signal PFout indicating a photon being incident on the SPAD 311.

Specifically, when the input voltage is equal to or higher than a predetermined threshold voltage Vth, the inverter 321 outputs a predetermined Low-level voltage. When the input voltage is lower than the threshold voltage Vth, the inverter 321 outputs a predetermined High-level voltage. Thus when a photon enters the SPAD 311 producing avalanche multiplication that in turn causes the cathode potential Vs to drop below the threshold voltage Vth, the output voltage of the inverter 321 is inverted from Low to High. On the other hand, when avalanche multiplication in the SPAD 311 stops and the cathode potential Vs rises to become equal to or higher than the threshold potential Vth, the output voltage of the inverter 321 is inverted from High to Low.

The inverter 322 outputs the light reception signal PFout by inverting and outputting the output voltage of the inverter 321. Therefore the light reception signal PFout is a Low-active pulse signal. That is, when a photon entering the SPAD 311 produces avalanche multiplication, i.e., when photon incidence is detected by the SPAD 311, the Low-level pulse type light reception signal PFout indicating a photon being incident on the SPAD 311 is output. The light reception signal PFout is the pixel signal output from the pixel 301.

Incidentally, the output section 313 is not limited to the configuration having both the inverter 321 and the inverter 322. The output section 313 may be configured as desired as long as it can output the light reception signal PFout. For example, the inverter 321 may be replaced with a transistor constituted by a P-type MOSFET.

The pulse generation section 314 outputs a pulse signal Pc of a predetermined width in synchronism with the output of the light reception signal PFout. More specifically, the pulse generation section 314 outputs the pulse signal Pc of a predetermined width upon detection of the light reception signal PFout, i.e., at a falling edge of the pulse-type light reception signal PFout.

The switch 315 is turned off in synchronism with the pulse signal Pc from the pulse generation section 314. More specifically, the switch 315 is turned off during the period in which the pulse signal Pc is being input and is turned on during other periods. An example of the switch 315 is a complementary switch that combines an NMOS transistor and a PMOS transistor. The switch 315 is not limited to the complementary switch and may be configured alternatively with multiple transistors. There can be many other alternative configurations of the switch 315 as long as they permit connection and disconnection of currents.

The transistor 316 constitutes a pull-in section that pulls in the input current Iin flowing through the SPAD 311 via the transistor 312 in order to suppress the flow of the input current Iin to the SPAD 311. The transistor 316 is turned on in synchronism with the pulse signal Pc from the pulse generation section 314. More specifically, the transistor 316 is turned on during the period in which the pulse signal Pc is being input to the gate and is turned off during other periods.

Originally, the transistor 316 is required to pull the cathode potential Vs into ground. When operated in synchronism with the pulse signal, the transistor 316 may be used for an after-pulse countermeasure, to be discussed later, without adding new circuit components. Also, a single switch (i.e., transistor 316) may be used either as a switch to block currents to the unused pixel 301 or as a switch to suppress after-pulse generation. That is, two purposes are simultaneously achieved by one switch used for the after-pulse countermeasure with no new circuit components added.

The pixel array section 201 in the imaging element 142 may be of a stacked type. For example, the SPAD 311 may be formed on a first semiconductor substrate, with the transistor 312, output section 313, pulse generation section 314, switch 315, and transistor 316 formed on a second semiconductor substrate stacked on the first semiconductor substrate. Such a configuration enlarges the light-receiving area of the SPAD 311 and thereby permits reception of more photons. The configuration also provides for the design of refining each of the pixels in size, making it possible to generate high-resolution range images. Incidentally, the components formed on the first and the second semiconductor substrates may be changed as needed. For example, the transistor 312 may be formed on the first semiconductor substrate.

FIG. 16 is a cross-sectional diagram depicting a configuration example of the pixel 301. FIG. 17 is a plan view depicting a configuration example of the wiring layer of the pixel 301.

As depicted in FIG. 16, the imaging element 142 has a multilayer structure in which a sensor board 331, a sensor-side wiring layer 332, and a logic-side wiring layer 333 are stacked one on top of the other. A logic circuit board, not depicted, is stacked on the logic-side wiring layer 333. Formed on the logic circuit board are, for example, the vertical drive section 202, column processing section 203, horizontal drive section 204, system control section 205, signal processing section 208, and a data storage section 209 in FIG. 14, as well as the transistor 312, output section 313, pulse generation section 314, switch 315, and transistor 316 in FIG. 15. The imaging element 142 is manufactured, for example, by the method of forming the sensor-side wiring layer 332 on the sensor board 331 and the logic-side wiring layer 333 on the logic circuit board, before bonding the sensor-side wiring layer 332 and the logic-side wiring layer 333 together over a bonding plane (indicated by broken line in FIG. 16).

The sensor board 331 is a semiconductor substrate formed by a thin slice of monocrystal silicon, for example. On this substrate, the concentration of p-type or n-type impurities is controlled. A SPAD 311 is formed in each pixel 301. In FIG. 16, the bottom surface of the sensor board 331 is a light-receiving surface. The sensor-side wiring layer 332 is stacked on the top surface opposite to the light-receiving surface.

Formed in the sensor-side wiring layer 332 and the logic-side wiring layer 333 are the wiring for supplying voltages to the SPAD 311 and the wiring for pulling out electrons generated by the SPAD 311 from the sensor board 331, among others.

The SPAD 311 is configured with an N-well 341, a P-type diffusion layer 342, an N-type diffusion layer 343, a hole storage layer 344, a pinning layer 345, and a high-concentration P-type diffusion layer 346 formed in the sensor board 331. In the SPAD 311, an avalanche multiplication region 347 is formed by a depletion layer produced in a region where the P-type diffusion layer 342 and the N-type diffusion layer 343 are connected with each other.

The N-well 341 is formed by having the concentration of impurities in the sensor board 331 controlled to the n-type. The N-well 341 generates an electric field that transfers the electrons produced by photoelectric conversion in the SPAD 311 to the avalanche multiplication region 347. Alternatively, the N-well 341 may be replaced with a P-well formed by having the concentration of impurities in the sensor board 331 controlled to the p-type.

The P-type diffusion layer 342, located near the surface of the sensor board 331, is a high-concentration P-type diffusion layer (P+) formed on the back side of the N-type diffusion layer 343 (bottom side in FIG. 16). The P-type diffusion layer 342 is configured to cover approximately the entire surface of the SPAD 311.

The N-type diffusion layer 343, located near the surface of the sensor board 331, is a high-concentration N-type diffusion layer (N+) formed on the surface side of the P-type diffusion layer 342 (top side in FIG. 16). The N-type diffusion layer 343 is configured to cover approximately the entire surface of the SPAD 311. Also, the N-type diffusion layer 343 is formed in a partially concave shape reaching the surface side of the sensor board 331 so as to be connected with a contact electrode 361 that supplies a negative voltage to produce the avalanche multiplication region 347.

The hole storage layer 344 is a P-type diffusion layer (P) that is formed to surround the side and bottom surfaces of the N-well 341 and stores holes. Further, the hole storage layer 344 is electrically connected with the anode of the SPAD 311 to permit bias adjustment. This raises the concentration of holes in the hole storage layer 344 to strengthen pinning including the pinning layer 345, thereby suppressing the generation of a dark current, for example.

The pinning layer 345 is a high-concentration P-type diffusion layer (P+) formed on a surface outside the hole storage layer 344 (i.e., side surface in contact with the back side of the sensor board 331 and with an insulating film 352). As with the hole storage layer 344, the pinning layer 345 suppresses the generation of a dark current, for example.

The high-concentration P-type diffusion layer 346, located near the surface of the sensor board 331, is a high-concentration P-type diffusion layer (P++) formed in a manner surrounding the outer circumference of the N-well 341. The high-concentration P-type diffusion layer 346 is used to connect with a contact electrode 362 that electrically connects the hole storage layer 344 with the anode of the SPAD 311.

The avalanche multiplication region 347 is a high electric field region formed by a large negative voltage applied to the N-type diffusion layer 343 over a boundary surface between the P-type diffusion layer 342 and the N-type diffusion layer 343. The avalanche multiplication region 347 multiplies electrons (e−) generated by a photon entering the SPAD 311.

Also in the imaging element 142, the adjacent SPADs 311 are isolated and separated from one another by an interposing double-structure pixel-to-pixel separation section 353 that includes a metal film 351 and an insulating film 352. For example, the pixel-to-pixel separation section 353 is formed in a manner penetrating from the back side to the surface side of the sensor board 331.

The metal film 351 is formed by a light-reflecting metal (e.g., tungsten). The insulating film 352 is a film that has insulating properties, such as an SiO₂ film. The pixel-to-pixel separation section 353 is formed, for example, with the metal film 351 embedded in the sensor board 331 in such a manner that the surface of the metal film 351 is covered by the insulating film 352. The pixel-to-pixel separation section 353 thus formed separates the adjacent SPADs 311 from each other electrically and optically.

Formed in the sensor-side wiring layer 332 are contact electrodes 361 to 363, metal wiring 364 to 366, contact electrodes 367 to 369, and metal pads 370 to 372.

The contact electrode 361 connects the N-type diffusion layer 343 with the metal wiring 364. The contact electrode 362 connects the high-concentration p-type diffusion layer 346 with the metal wiring 365. The contact electrode 363 connects the metal film 351 with the metal wiring 366.

The metal wiring 364 is formed to cover at least the avalanche multiplication region 347, i.e., to be wider than the avalanche multiplication region 347 as depicted in FIG. 17, for example. The metal wiring 364 reflects the light transmitted through the SPAD 311 into the SPAD 311 as indicated by a hollow arrow in FIG. 16.

The metal wiring 365 is formed in a manner surrounding the outer circumference of the metal wiring 364 and overlapping with the high-concentration P-type diffusion layer 346 as depicted in FIG. 17, for example. The metal wiring 366 is formed to be connected with the metal film 351 at four corners of the pixel 301 as illustrated in FIG. 7, for example.

The contact electrode 367 connects the metal wiring 364 with the metal pad 370. The contact electrode 368 connects the metal wiring 365 with the metal pad 371. The contact electrode 369 connects the metal wiring 366 with the metal pad 372.

The metal pads 370 to 372 are used to bond electrically and mechanically with metal pads 391 to 393, respectively, that are formed in the logic-side wiring layer 333, the bonding being achieved by use of the metal (Cu) constituting the pads.

Formed in the logic-side wiring layer 333 are electrode pads 381 to 383, an insulating layer 384, contact electrodes 385 to 390, and metal pads 391 to 393.

The electrode pads 381 to 383 are each used to connect with the logic circuit board (not depicted). The insulating layer 384 insulates the electrode pads 381 to 383 from each other.

The contact electrodes 385 and 386 connect the electrode pad 381 with the metal pad 391. The contact electrodes 387 and 388 connect the electrode pad 381 with the metal pad 392. The contact electrodes 389 and 390 connect the electrode pad 383 with the metal pad 393.

The metal pad 391 is bonded with the metal pad 370. The metal pad 392 is bonded with the metal pad 371. The metal pad 393 is bonded with the metal pad 372.

In the above-described wiring structure, the electrode pad 381 is connected, for example, with the N-type diffusion layer 343 via the contact electrodes 385 and 386, metal pads 391 and 370, contact electrode 367, metal wiring 364, and contact electrode 361. Thus in the pixel 301, a high negative voltage applied to the N-type diffusion layer 343 is supplied to the electrode pad 381 from the logic circuit board.

Also, the electrode pad 381 is configured to connect with the high-concentration P-type diffusion layer 346 via the contact electrodes 387 and 388, metal pads 392 and 371, contact electrode 368, metal wiring 365, and contact electrode 362. Thus in the pixel 301, the anode of the SPAD 311 connected electrically with the hole storage layer 344 is connected with the electrode pad 381. This permits bias adjustment of the hole storage layer 344 via the electrode pad 381.

Also, the electrode pad 383 is configured to connect with the metal film 351 via the contact electrodes 389 and 390, metal pads 393 and 372, contact electrode 369, metal wiring 366, and contact electrode 363. Thus in the pixel 301, a bias voltage supplied to the electrode pad 383 from the logic circuit board is applied to the metal film 351.

In the pixel 301, as described above, the metal wiring 364 is formed to cover at least the avalanche multiplication region 347, i.e., to be wider than the avalanche multiplication region 347. Also, the metal film 351 is formed in a manner penetrating the sensor board 331. That is, the pixel 301 is configured to let the metal wiring 364 and the metal film 351 entirely surround the SPAD 311 except for its light incident plane in a light-reflecting structure. The structure allows the pixel 301 to prevent generation of optical crosstalk thank to the effect of reflecting light by the metal wiring 364 and the metal film 351. This improves the sensitivity of the SPAD 311 at the same time.

Also, the pixel 301 is configured to let the hole storage layer 344 surround the side and bottom surfaces of the N-well 341 and to connect the hole storage layer 344 electrically with the anode of the SPAD 311, thereby enabling bias adjustment. Furthermore, the pixel 301 has the bias voltage applied to the metal film 351 of the pixel-to-pixel separation section 353 so as to generate an electric field for assisting carriers in the avalanche multiplication region 347.

The pixel 301 configured as described above prevents generation of cross-talk and improves the sensitivity of the SPAD 311. As a result, the pixel characteristics are improved.

<Workings of the Pixel>

Figure 18:
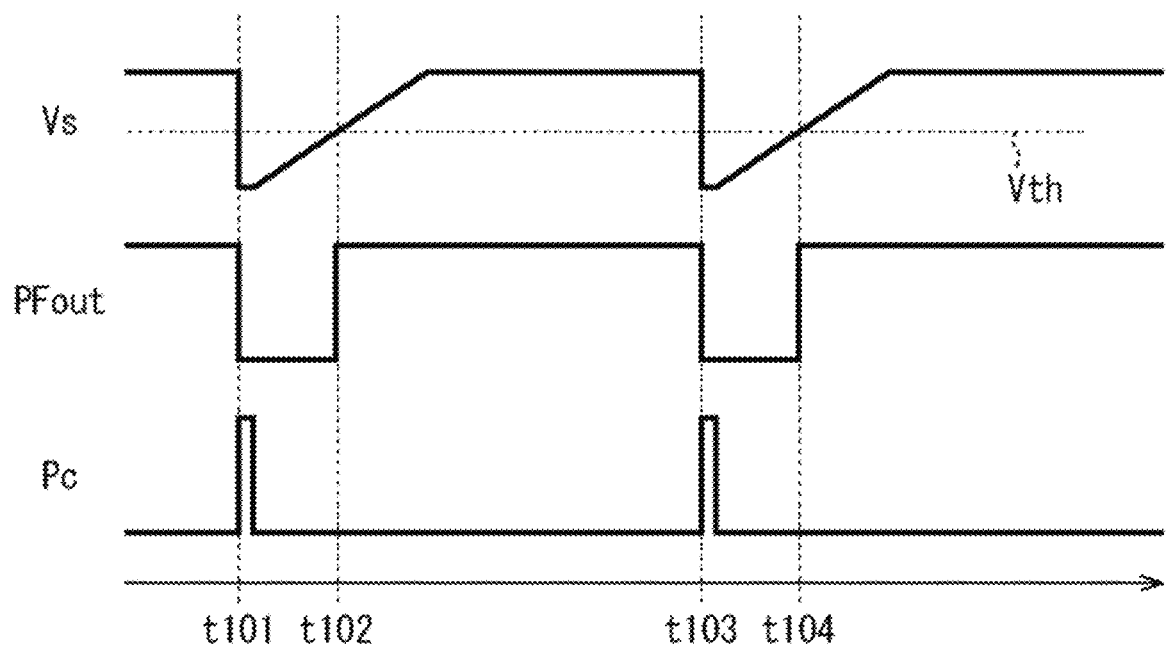
FIG. 18 is a timing chart explaining the workings of a pixel.

The workings of the pixel 301 are explained next with reference to the timing chart of FIG. 18.

Before time t101, the cathode potential Vs is approximately equal to the potential Ve. With a reverse voltage equal to or higher than the breakdown voltage Vbd applied to the SPAD 311, the SPAD 311 is set to Geiger mode.

At time t101, a photon entering the SPAD 311 produces avalanche multiplication causing a current to flow through the SPAD 311. This in turn causes a current to flow through the transistor 312, producing a voltage drop and lowering the cathode potential Vs. When the cathode potential Vs drops below the threshold voltage Vth, the output voltage of the inverter 321 is inverted from Low to High, and the output voltage of the inverter 322 is inverted from High to Low. That is, the inverter 322 outputs a Low-active light reception signal PFout.

The pulse generation section 314 outputs the pulse signal Pc of a predetermined width upon detection of the light reception signal PFout.

The pulse signal Pc is input to the control terminal of the switch 315. While the pulse signal Pc is being input, the switch 315 is turned off. This blocks the input path of the input current Iin to the SPAD 311. That is, the pulse signal Pc is output in synchronism with the output of the light reception signal PFout. The switch 315 is turned off in synchronism with the pulse signal Pc. This blocks the current flowing through the SPAD 311.

Also, the pulse signal Pc is input to the gate of the transistor 316. While the pulse signal Pc is being input to the gate, the transistor 316 is turned on. This causes the path through which the input current Iin flows to transition from the SPAD 311 to the transistor 316. That is, the input current Iin is pulled into the transistor 316, so that the flow of the input current Iin to the SPAD 311 is suppressed. That is to say, the pulse signal Pc is output in synchronism with the output of the light reception signal PFout, with the transistor 316 turned on in synchronism with the pulse signal Pc, thereby pulling in the input current Iin. This suppresses the current flowing through the SPAD 311.

As described above, the switch 315 blocks the current flowing through the SPAD 311, with the transistor 316 suppressing the current flowing through the SPAD 311. This causes the current flowing through the SPAD 311 to become smaller than the latching current Iq regardless of the magnitude of the input current Iin, practically eliminating carriers from inside the depletion layer of the SPAD 311. This in turn stops the avalanche multiplication in the SPAD 311 and raises the impedance thereof.

While the current flowing through the SPAD 311 is being blocked or suppressed, after-pulse generation is suppressed. As discussed above, the probability of after-pulse generation is maximized immediately after the generation of avalanche multiplication in the SPAD 311 and decreases exponentially thereafter over time. Thus with after-pulse generation suppressed immediately after the generation of avalanche multiplication in the SPAD 311, the probability of after-pulse generation is reduced significantly. With the after-pulse generation thus suppressed, the dead time is prevented from being prolonged or varied. Furthermore, erroneous detection of photon incidence on the SPAD 311 is suppressed.

Thereafter, the pulse signal Pc is turned off, the switch 315 is turned on, and the transistor 316 is turned off. This allows the current to start flowing through the SPAD 311. When the carriers accumulated in the SPAD 311 by avalanche multiplication are discharged through the transistor 312, the cathode potential Vs is raised.

At time t102, the cathode potential Vs reaches the threshold voltage Vth. This causes the inverter 321 to invert its output voltage from High to Low and the inverter 322 to invert its output voltage from Low to High. That is, the output of the light reception signal PFout from the inverter 322 is stopped.

Thereafter, the cathode potential Vs recovers to a level near the initial potential Ve, setting the SPAD 311 again to Geiger mode and terminating the dead time. That is, while the pulse signal Pc is not being input, the switch 315 is turned on and the transistor 316 is turned off. This causes the current to be supplied continuously to the SPAD 311, allowing the SPAD 311 to output the light reception signal reliably in response to photon incidence.

Then as indicated at time t103 and at time t104, similar operations are repeated every time a photon enters the SPAD 311.

As described above, the pixel 301 has the avalanche multiplication stopped reliably regardless of the magnitude of the input current Iin. This allows the input current Iin to be larger and makes the dead time shorter than before.

Because the probability of after-pulse generation is considerably reduced, the dead time is prevented from being prolonged or varied. Further, erroneous detection of photon incidence on the SPAD 311 is suppressed. With the dead time prevented from being prolonged, the number of times distance measurement is performed per unit time is increased. As a result, the proportion of the noise component in the components required for distance measurement is reduced.

Moreover, the cathode potential of the SPAD 311 is put in a floating state only momentarily. It follows that noise resistance decreases very little.

The accuracy of detecting a photon entering the SPAD 311 is thus improved. As a result, the accuracy of distance measurement is enhanced.

The advantageous effects described above are only examples and are not limitative of the present technology. There may be additional advantageous effects derived from and not covered by this description.

3. Variations

Explained below are some variations of the above-described embodiment of the present technology.

For example, the transistor 312 in the pixel 301 may be replaced with a resistor.

As another example, either the switch 315 or the transistor 316 in the pixel 301 may be omitted.

As a further example, the pull-in section that pulls in the input current Iin may be configured differently from the transistor 316.

As a still further example, the light reception signal PFout from the pixel 301 may be a High-active signal.

It was explained, for example, that the signal processing circuit 143 generates the range image. Alternatively, the imaging element 142 may internally generate and output the range image.

It was also explained, for example, that the present technology is applied to the imaging element for range image acquisition. Alternatively, this technology may be applied to an imaging element that includes color filters and is configured to acquire pictures for imaging purposes.

4. Usage Examples of the Imaging System

Figure 19:
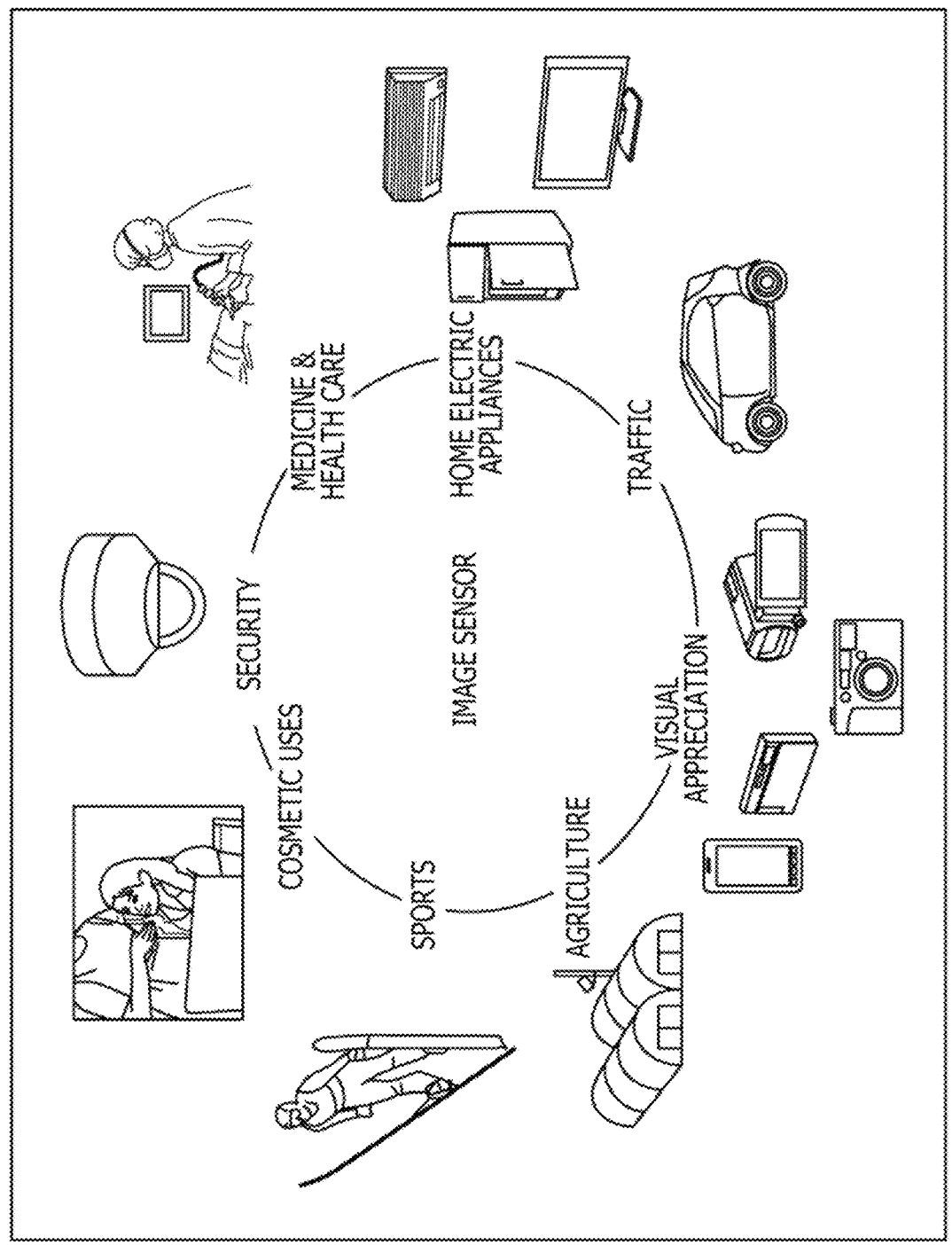
FIG. 19 is a schematic diagram depicting usage examples of the imaging system.

FIG. 19 is a schematic diagram depicting usage examples of the above-described imaging system 101.

The imaging system 101 described above may be used in diverse manners, such as in cases where diverse types of light including visible light, infrared light, ultraviolet radiation, or X-radiation are sensed, as outlined below.

- Cases of devices that capture images for use in visual appreciation, such as digital cameras and camera function-equipped mobile phones.
- Cases of devices for use in the field of vehicle traffic, including onboard sensors that capture images of the front side, rear side, surroundings, and interior of a vehicle to ensure safe operations such as automated vehicle stop and to recognize the driver's status; surveillance cameras for monitoring passing vehicles and the roads on which they travel; and distance measurement sensors for measuring the distance between vehicles.
- Cases of devices that capture images of users' gestures to operate home electric appliances such as TV sets, refrigerators, and air conditioners in a manner reflecting the gestures.
- Cases of devices for use in the field of medicine and health care, such as endoscopes and instruments that capture images of blood vessels using received infrared radiation.
- Cases of devices for use in the field of security, such as surveillance cameras for crime prevention and cameras for personal authentication.
- Cases of devices for use in the field of beauty care, such as skin measuring instruments and microscopes for capturing images of the scalp.
- Cases of devices for use in the field of sports, such as action cameras and wearable cameras.
- Cases of devices for use in the field of agriculture, such as surveillance cameras for monitoring fields and crops.

<Example of Application to a Mobile Body>

The technology of the present disclosure (the present technology) may be applied to diverse products. For example, the technology may be implemented as an apparatus to be mounted on such mobile bodies as automobiles, electric vehicles, hybrid electric vehicles, motorcycles, bicycles, personal mobility devices, aircraft, drones, ships, and robots.

Figure 20:
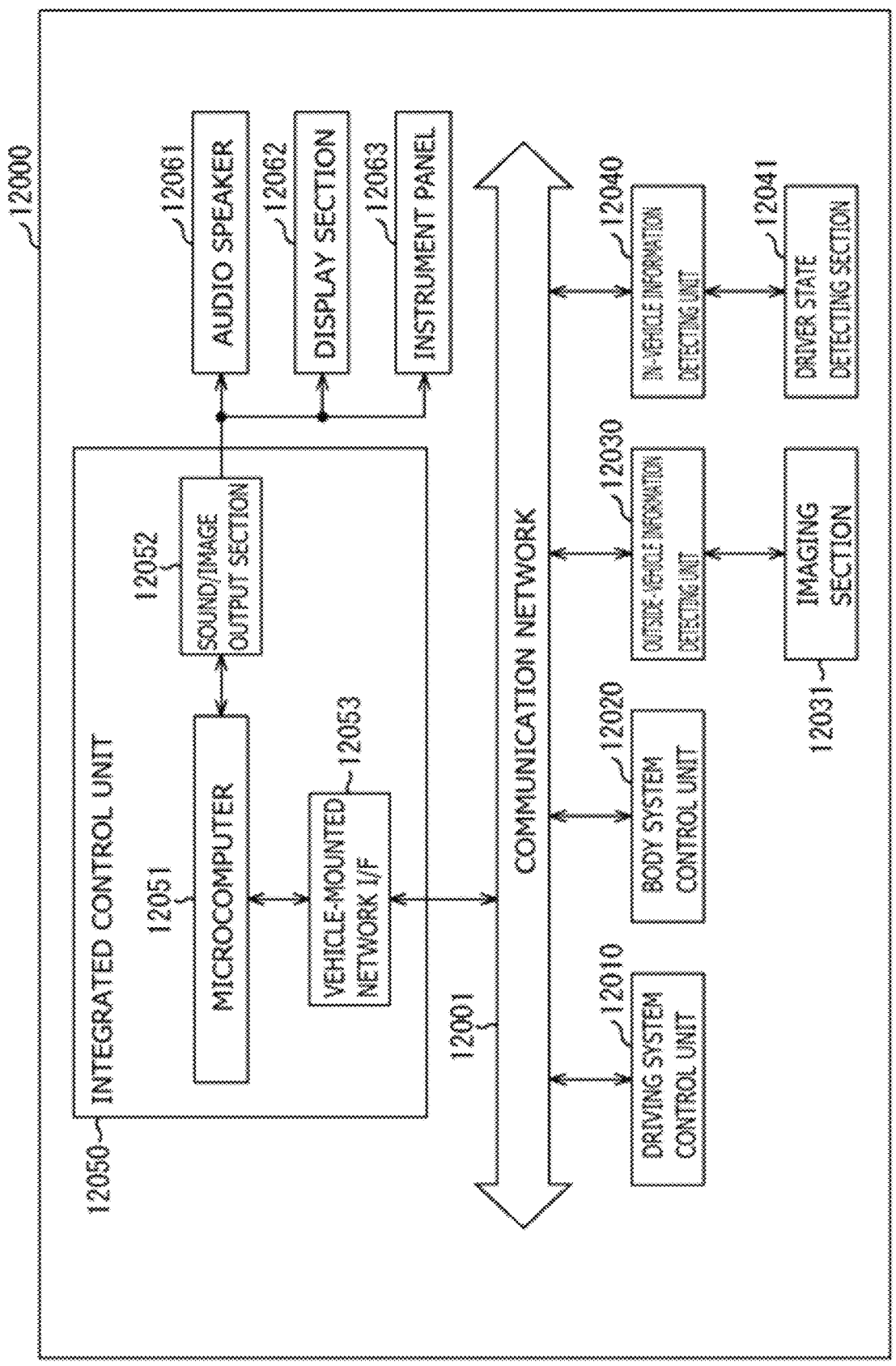
FIG. 20 is a block diagram depicting an example of schematic configuration of a vehicle control system.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

Figure 21:
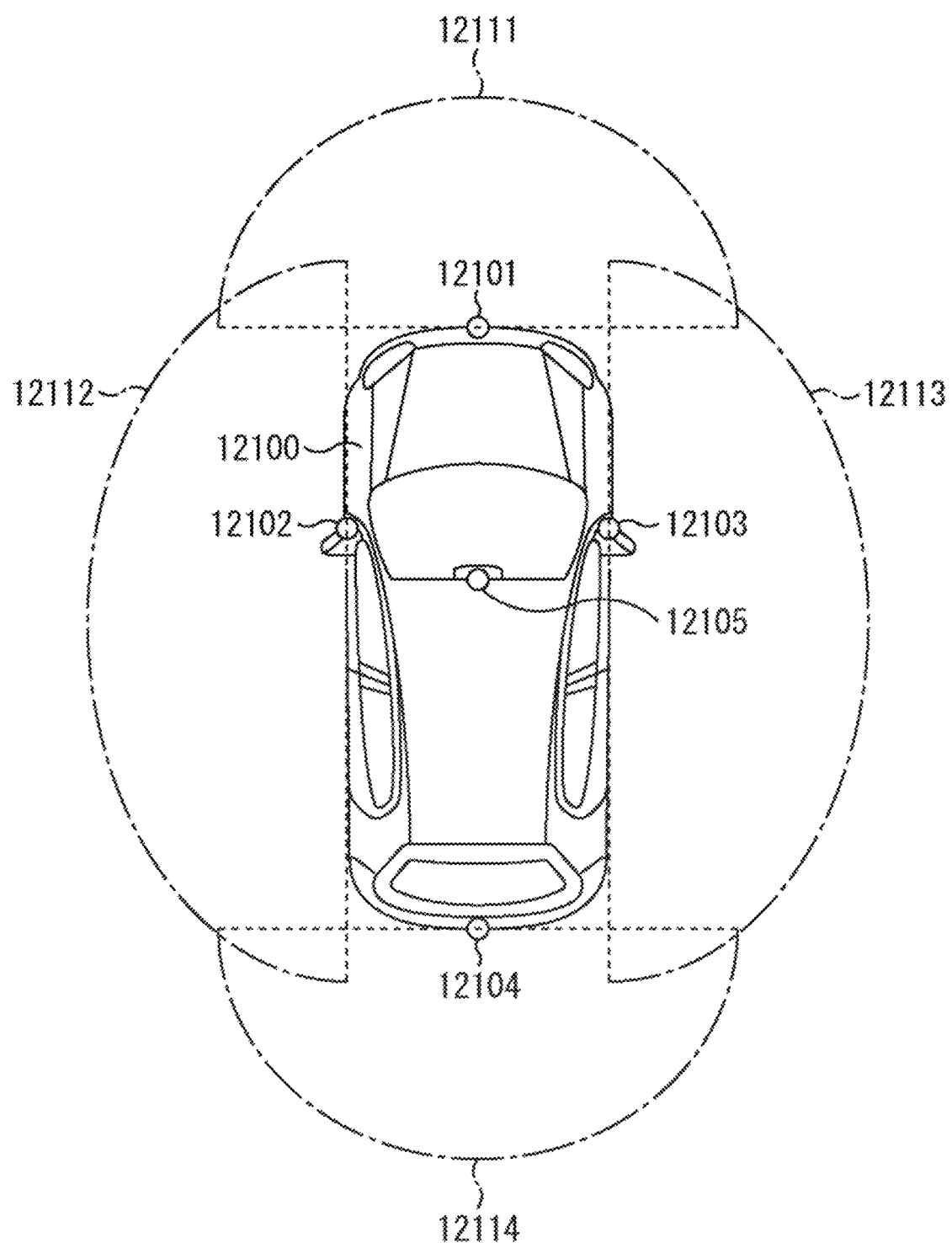
FIG. 21 is a diagram of assistance in explaining an example of installation positions of an outside-vehicle information detecting section and an imaging section.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/h). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology of the present disclosure can be applied was explained above. This technology may be applied to the imaging section 12031 from among the components discussed above. Specifically, the imaging system 101 in FIG. 13, for example, may be adopted as the imaging section 12031. The imaging section 12031 is, for example, a LIDAR sensor used to detect objects near the vehicle 12100 and the distances to these objects. Applying the technology of the present disclosure to the imaging section 12031 improves the accuracy of detecting objects near the vehicle 12100 and the distances to these objects. As a result, a warning about an impending collision between the vehicle and obstacles is issued in a suitably timed manner, which contributes to preventing traffic accidents.

In this description, the term "system" refers to an aggregate of multiple components (e.g., apparatuses or modules (parts)). It does not matter whether all components are housed in the same enclosure. Thus a system may be configured with multiple apparatuses housed in separate enclosures and interconnected via a network, or with a single apparatus that houses multiple modules in a single enclosure.

The embodiments of the present technology are not limited to those discussed above and may be modified or altered diversely within the scope of this technology.

Furthermore, the technology may be configured preferably as follows:

(1)

An imaging apparatus including:

a pixel array section (201) having pixel sections arrayed therein, each of the pixel sections including:

an SPAD (single photon avalanche photodiode) (311);

a resistance component (312) configured to be connected serially with the SPAD (311);

an output section (313) configured to output a light reception signal indicating photon incidence on the SPAD (311); and a pulse generation section (314) configured to output a pulse signal in synchronism with the output of the light reception signal;

in which each of the pixel sections at least further includes at least one of:

a switch (315) configured to be connected interposingly between the SPAD (311) and the resistance component (312) and turned off in synchronism with the pulse signal; or a pull-in section (316) configured to pull in an input current flowing through the SPAD (311) via the resistance component (312) in synchronism with the pulse signal, thereby suppressing the input current flowing through the SPAD (311).

(2)

The imaging apparatus as stated in paragraph (1) above, in which the switch (315) is turned off when the pulse signal is input and is turned on when the pulse signal is not input.

(3)

The imaging apparatus as stated in paragraph (1) or (2) above, in which the switch (315) is connected interposingly between a cathode of the SPAD (311) and the resistance component.

(4)

The imaging apparatus as stated in paragraph (3) above, in which the switch (315) is connected interposingly between a branch point from which the signal line from the cathode of the SPAD (311) branches in a direction of the resistance component (312) and in a direction of the output section on one hand, and the resistance component (312) on the other hand.

(5)

The imaging apparatus as stated in any one of paragraphs (1) to (4) above, in which the pull-in section (316) pulls in the input current when the pulse signal is input and does not pull in the input current when the pulse signal is not input.

(6)

The imaging apparatus as stated in paragraph (5) above, in which the pull-in section (316) includes a transistor configured to be connected interposingly between the cathode of the SPAD (311) and ground, the gate of the transistor receiving input of the pulse signal.

(7)

The imaging apparatus as stated in any one of paragraphs (1) to (6) above, in which the pulse generation section (314) outputs the pulse signal of a predetermined width upon detection of the light reception signal.

(8)

The imaging apparatus as stated in any one of paragraphs (1) to (7) above, in which the resistance component (312) includes a MOSFET.

(9)

The imaging apparatus as stated in any one of paragraphs (1) to (8) above, in which the output section (313) outputs the light reception signal on the basis of a cathode potential of the SPAD (311).

(10)

The imaging apparatus as stated in any one of paragraphs (1) to (9) above, in which the switch includes multiple transistors.

(11)

The imaging apparatus as stated in any one of paragraphs (1) to (10) above, in which the SPAD (311) is formed on a first semiconductor substrate and at least one of the resistance component (312), the output section (313), the pulse generation section (314), the switch (315), or the pull-in section (316) is formed on a second semiconductor substrate stacked on the first semiconductor substrate.

(12)

An imaging system including:

a lighting apparatus configured to emit irradiation light; and an imaging apparatus configured to receive reflected light stemming from the irradiation light;

in which the imaging apparatus includes a pixel array section (201) having pixel sections arrayed therein, each of the pixel sections including:

an SPAD (single photon avalanche photodiode) (311);

a resistance component (312) configured to be connected serially with the SPAD;

an output section (313) configured to output a light reception signal indicating photon incidence on the SPAD; and a pulse generation section (314) configured to output a pulse signal in synchronism with the output of the light reception signal;

in which each of the pixel sections further includes at least one of:
- a switch (315) configured to be connected interposingly between the SPAD (311) and the resistance component (312) and turned off in synchronism with the pulse signal; or
- a pull-in section (316) configured to pull in an input current flowing through the SPAD (311) via the resistance component (312) in synchronism with the pulse signal, thereby suppressing the input current flowing through the SPAD (311).

The advantageous effects stated in this description are only examples and are not limitative of the present technology. There may be additional advantageous effects derived from this description.

REFERENCE SIGNS LIST

101 Imaging system, 111 Lighting apparatus, 112 Imaging apparatus, 121 Lighting control section, 122 Light source, 131 Imaging section, 132 Control section, 142 Imaging element, 143 Signal processing circuit, 201 Pixel array section, 301 Pixel, 311 SPAD, 312 Transistor, 313 Output section, 314 Pulse generation section, 315 Switch, 316 Transistor, 321, 322 Inverter

The invention claimed is:

1. A light detecting device comprising:
an avalanche photodiode having a first terminal and a second terminal, the first terminal of the avalanche photodiode being coupled to a first potential;
a current source configured to supply a current from a second potential to the avalanche photodiode and to perform passive quenching;
an output circuit coupled to the second terminal of the avalanche photodiode and configured to output a light reception signal;
a pulse generation circuit configured to output a pulse signal based on the light reception signal;
a transistor disposed between the second terminal and a third potential; and
a switch configured to selectively limit the current based on the pulse signal,
wherein an output of the pulse generation circuit is coupled to both a gate of the transistor and the switch, wherein the avalanche photodiode, the switch, and the current source are directly connected in series between the first potential and the second potential, and wherein the switch is interposed between the second terminal of the avalanche photodiode and the current source.

2. The light detecting device according to claim 1, wherein the transistor pulls in an input current flowing through the avalanche photodiode when the pulse signal is input and does not pull in the input current when the pulse signal is not input.

3. The light detecting device according to claim 1, wherein the pulse generation circuit outputs the pulse signal upon detection of the light reception signal, wherein the pulse signal is output with a predetermined width.

4. The light detecting device according to claim 1, wherein the current source includes a transistor.

5. The light detecting device according to claim 1, wherein the output circuit outputs the light reception signal on a basis of a potential of the second terminal of the avalanche photodiode.

6. The light detecting device according to claim 1, wherein the switch is coupled in series with the avalanche photodiode and the current source.

7. The light detecting device according to claim 1, wherein the switch comprises a transistor.

8. The light detecting device according to claim 1, wherein the second terminal comprises a cathode of the avalanche photodiode.

9. The light detecting device according to claim 1, wherein the output circuit includes at least one inverter.

10. The light detecting device according to claim 1, wherein a first switch terminal of the switch is connected to the current source and a second switch terminal of the switch is connected to the second terminal of the avalanche photodiode.

11. A light detecting system, comprising:
a lighting apparatus configured to emit irradiation light; and
a light detecting apparatus configured to receive reflected light;
wherein the light detecting apparatus includes
an avalanche photodiode having a first terminal and a second terminal, the first terminal of the avalanche photodiode being coupled to a first potential;
a current source configured to supply a current from a second potential to the avalanche photodiode and to perform passive quenching;
an output circuit coupled to the second terminal of the avalanche photodiode and configured to output a light reception signal;
a pulse generation circuit configured to output a pulse signal based on the light reception signal;
a transistor disposed between the second terminal and a third potential; and
a switch configured to selectively limit the current based on the pulse signal,
wherein an output of the pulse generation circuit is coupled to both a gate of the transistor and the switch, wherein the avalanche photodiode, the switch, and the current source are directly connected in series between the first potential and the second potential, and wherein the switch is interposed between the second terminal of the avalanche photodiode and the current source.

12. A light detecting device comprising:
an avalanche photodiode having a first terminal and a second terminal, the first terminal of the avalanche photodiode being coupled to a first potential;
a current source configured to supply a current from a second potential to the avalanche photodiode and to quenching;
an output circuit coupled to the second terminal of the avalanche photodiode and configured to output a light reception signal;
a pulse generation circuit configured to output a pulse signal based on the light reception signal;
a transistor disposed between the second terminal and a third potential; and
a switch configured to selectively limit the current based on the pulse signal,
wherein an output of the pulse generation circuit is coupled to both a gate of the transistor and the switch, wherein the avalanche photodiode, the switch, and the current source are directly connected in series between the first potential and the second potential, and wherein the switch is turned off when the pulse signal is input and is turned on when the pulse signal is not input.

* * * * *